US010461499B2

(12) United States Patent
Nerheim

(10) Patent No.: US 10,461,499 B2
(45) Date of Patent: Oct. 29, 2019

(54) SYSTEMS AND METHODS FOR CALIBRATING, OPERATING, AND SETTING A LASER DIODE IN A WEAPON

(71) Applicant: Axon Enterprise, Inc., Scottsdale, AZ (US)

(72) Inventor: Magne Nerheim, Paradise Valley, AZ (US)

(73) Assignee: Axon Enterprise, Inc., Scottsdale, AZ (US)

( * ) Notice: Subject to any disclaimer, the term of this patent is extended or adjusted under 35 U.S.C. 154(b) by 81 days.

(21) Appl. No.: 15/658,001

(22) Filed: Jul. 24, 2017

(65) Prior Publication Data
US 2018/0183208 A1 Jun. 28, 2018

Related U.S. Application Data

(60) Provisional application No. 62/438,602, filed on Dec. 23, 2016.

(51) Int. Cl.
| | |
|---|---|
| *H01S 5/0683* | (2006.01) |
| *G01J 1/18* | (2006.01) |
| *G01J 1/42* | (2006.01) |
| *H01S 5/042* | (2006.01) |
| *H01S 5/06* | (2006.01) |

(Continued)

(52) U.S. Cl.
CPC .............. *H01S 5/0683* (2013.01); *F41G 1/35* (2013.01); *F41G 1/545* (2013.01); *G01J 1/18* (2013.01); *G01J 1/32* (2013.01); *G01J 1/4257* (2013.01); *H01S 5/042* (2013.01); *H01S 5/0617* (2013.01); *H01S 5/06808* (2013.01); *H05C 1/00* (2013.01);

(Continued)

(58) Field of Classification Search
CPC .. H01S 5/0683; H01S 5/06808; H01S 5/0617; H01S 5/042; H01S 5/06825; F41G 1/545; F41G 1/35; G01J 1/32; G01J 1/18; G01J 1/4257; H05C 1/00; F41H 13/0025
See application file for complete search history.

(56) References Cited

U.S. PATENT DOCUMENTS

| 4,998,257 A * | 3/1991 | On | H01S 5/068 |
| | | | 372/29.02 |
| 5,179,235 A * | 1/1993 | Toole | F41G 1/35 |
| | | | 362/110 |

(Continued)

FOREIGN PATENT DOCUMENTS

TW 200717954 A 5/2007

OTHER PUBLICATIONS

Taiwan Patent Office, Taiwan Search Report and Office Action for Taiwanese patent application No. 106127345 dated Nov. 16, 2018.

*Primary Examiner* — Xinning (Tom) Niu
(74) *Attorney, Agent, or Firm* — Letham Law Firm

(57) ABSTRACT

Systems and methods for calibrating, operating, and setting the magnitude of the power of light provided by a laser diode in a conducted electrical weapon ("CEW"). The light of the laser diode assists in targeting by providing a visible indication of the projected point of impact of the tethered electrode of the CEW. The calibration process enables laser diode of a CEW to operate within regional guidelines of the maximum output power of light permitted by a laser. The method further permits the magnitude of the power of the light provided by a laser diode to be set and operated in changing environmental conditions in the field.

17 Claims, 11 Drawing Sheets

(51) Int. Cl.
  *H01S 5/068* (2006.01)
  *H05C 1/00* (2006.01)
  *G01J 1/32* (2006.01)
  *F41G 1/35* (2006.01)
  *F41G 1/54* (2006.01)
  *F41H 13/00* (2006.01)

(52) U.S. Cl.
  CPC ...... *F41H 13/0025* (2013.01); *H01S 5/06825* (2013.01)

(56) References Cited

U.S. PATENT DOCUMENTS

| | | | |
|---|---|---|---|
| 6,792,020 B2* | 9/2004 | Romm | H01S 5/06825 372/38.02 |
| 2002/0141461 A1 | 10/2002 | Liu | |
| 2004/0198336 A1 | 10/2004 | Jancic et al. | |
| 2006/0245623 A1 | 11/2006 | Loiacono et al. | |
| 2010/0250188 A1 | 9/2010 | Brown et al. | |

* cited by examiner

SYSTEMS AND METHODS FOR CALIBRATING, OPERATING, AND SETTING A LASER DIODE IN A WEAPON

FIELD OF INVENTION

Embodiments of the present invention relate to laser diodes.

BRIEF DESCRIPTION OF THE SEVERAL VIEWS OF THE DRAWING

Embodiments of the present invention will be described with reference to the drawing, wherein like designations denote like elements, and.

DETAILED DESCRIPTION OF INVENTION

Figure 1:
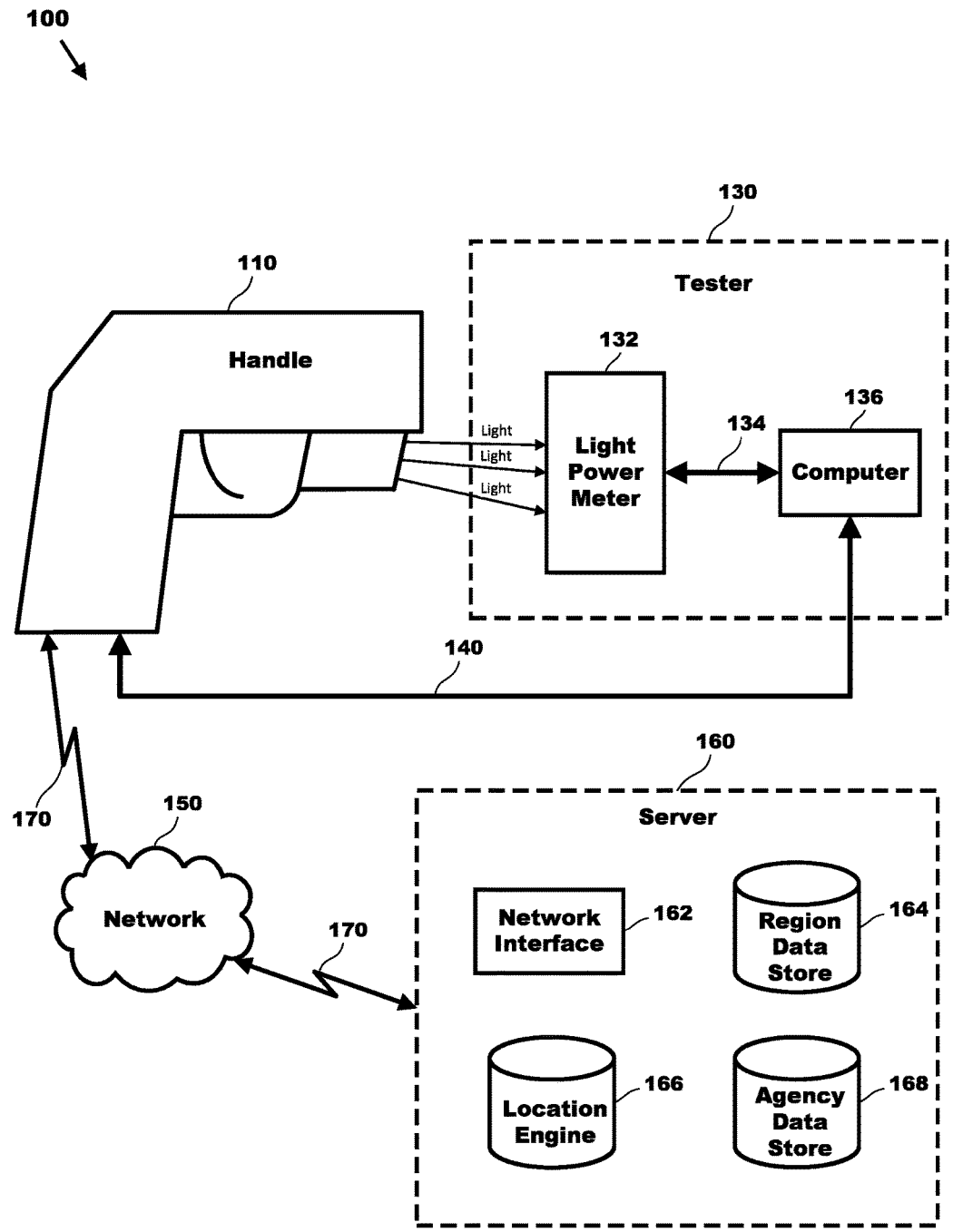
FIG. 1 is a functional block diagram of a system that creates an environment (e.g., ecosystem) for calibrating, transmitting information (e.g., data) related to calibration, and storing information related to calibration according to various aspects of the present disclosure.
Figure 2:
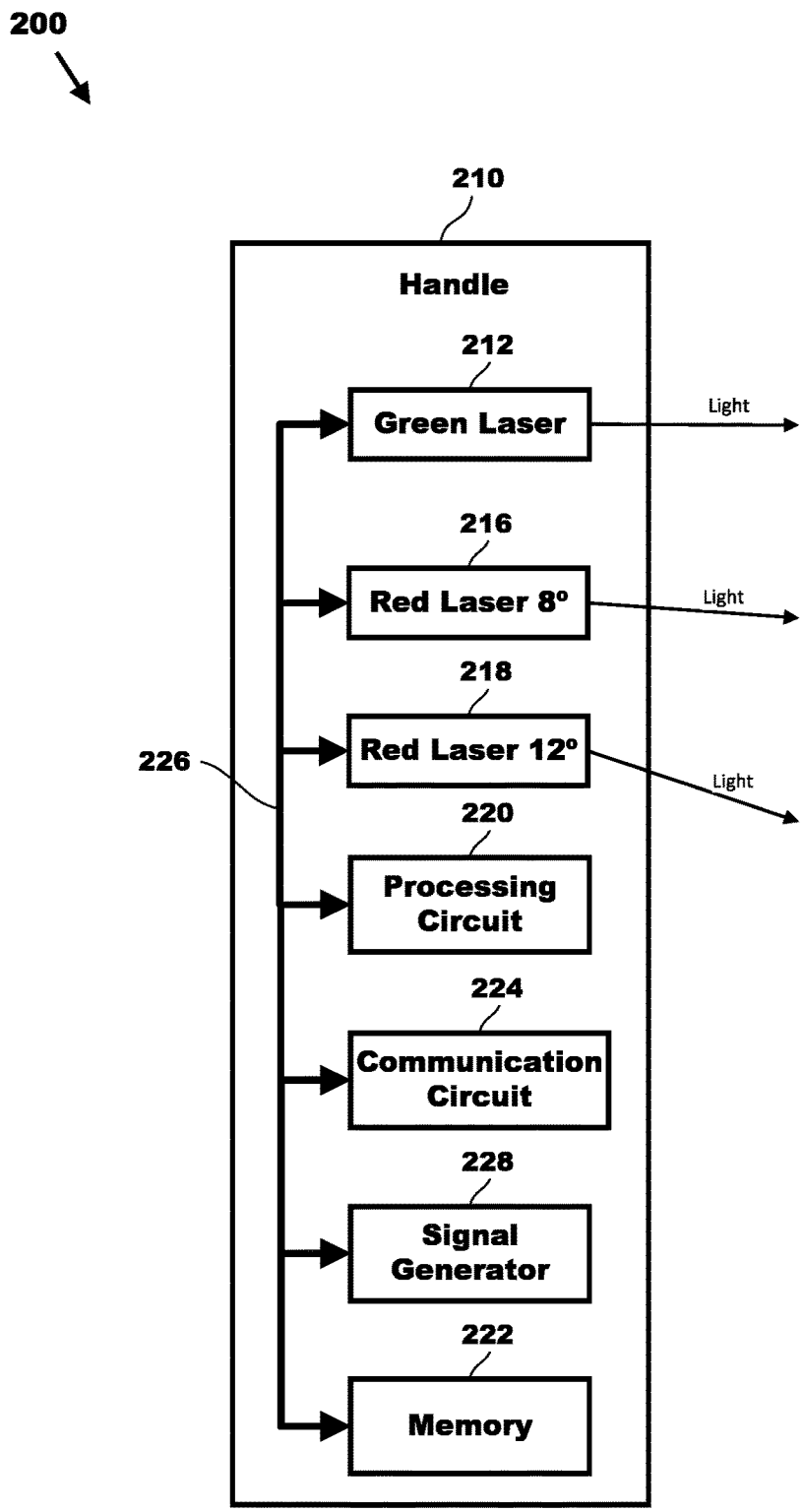
FIG. 2 is a functional block diagram of a handle with its laser diodes.

A conducted electrical weapon ("CEW") is a device that provides a stimulus signal through a human or animal target via launched electrodes. A stimulus signal inhibits locomotion of the target. Locomotion may be inhibited by interfering with voluntary use of skeletal muscles and/or causing pain in the target. A stimulus signal that interferes with skeletal muscles may cause the skeletal muscles to lockup (e.g., freeze, tighten, stiffen) so that the target may not voluntarily move.

A CEW may include a handle and one or more deployment units (e.g., cartridges). Deployment units removeably insert into the handle. A deployment unit includes one or more wire-tethered electrodes that are launched by a propellant toward a target to provide the stimulus signal through the target. A CEW may include one or more laser diodes for illuminating (e.g., targeting) a predicted point of impact of the electrodes of the deployment unit.

The disclosure provided herein is not limited to laser diodes that cooperate with a CEW. The methods and structures disclosed herein are applicable to any type of weapon (e.g., handgun, rifle, machine gun, cannon) that uses one or more lasers for aiming (e.g., targeting). Further, the methods and structures disclosed herein are not limited to weapons. Any type of device (e.g., laser chalk line, laser pointer, laser detector, holograph generator, lidar equipment, geological equipment, remote sensing equipment, seismology equipment, laser scanners, barcode readers) that emits laser light may benefit from using the methods and structures discussed herein to calibrate, set, and/or operate the magnitude of the power of the light provided by the laser.

Lasers may be potentially dangerous/hazardous to human eyesight. Laws for a region (e.g., country, state) may restrict the maximum output power of visible lasers. Laws for maximum output power of a laser vary by region.

Calibrating output power of a laser enables a CEW to operate within the limits of the law.

Although the above paragraphs discuss the use of a laser diode by a CEW for targeting, the disclosure herein is not limited to CEWs and/or laser diodes for targeting (e.g., aiming). The disclosure herein applies equally to lasers and/or laser diodes that provide light for any purpose. The disclosure herein applies equally to targeting devices used by conventional firearms, laser pointers used to indicate a portion of an object, lasers used in surgery, eye-targeted lasers to temporarily impair vision, holography, or any other use where it is desirable to provide light at a known power output.

Different regions have different maximum output power for lasers. Calibrating the diodes of a CEW to operate at one output power means that the CEW cannot be operated in a region where the law requires a lower output power. Calibrating to different maximum output powers means maintaining an inventory of different CEWs which is inconvenient. It would be a benefit to calibrate a CEW to operate at all powers required for all regions then provide the CEW with region information so it can operate within the laws of that region.

CEWs are hand-held systems and generally operate using a battery. It would be a benefit to operate the laser diodes so as to provide the desired output power while conserving battery power. The operating efficiency of a laser diode (i.e. electrical input power versus optical output power) is higher when operating at a higher light power output. A laser diode may be operated at higher optical output power for greater efficiency, but have its time of operation (e.g., on, off) controlled so that the average optical output power is within the permitted light power output for the region. By modulating the on-off operation of the laser diode, the laser diode provides the permitted optical output power and the average power used by the laser diode is reduced thereby extending battery life without an impact on laser visibility.

A power supply may include a boost (e.g., buck) circuit to provide the voltage and/or current needed to operate a laser diode.

A laser diode in a CEW may require calibration to ensure that a magnitude of a power of a light provided by the laser diode is less than or equal to a limit allowed in a region where the handle is operated. A CEW may cooperate with a tester (e.g., a light power meter and a computer) to calibrate (e.g., measure, adjust, standardize) the magnitude of the power of the light provided by the laser diode to be within a predetermined range. A range may have an upper value and a lower value. An upper value of a predetermined range may be the limit of the magnitude of the maximum light power output for a region. For example, the maximum laser power output for the U.S. is 5 mW. The maximum power output for a laser in Europe is 1 mW. The lower value may be zero; however, at zero output power, a laser diode does not provide any light. In practice, the lower value should be non-zero. The lower limit may be the least amount of power that provides an indication on a target visible to the user of the CEW. In practice, the lower limit is not less than 50% of the maximum power output of the region where the laser diode will be used. Preferably the lower value is about 20% less than the upper value.

Calibration of the laser diode output power enables the handle of CEW to operate the laser diode at a measured output power to comply with regional laws. A CEW may adjust (e.g., retain, increase, decrease) the magnitude of the power of the light delivered by a laser diode.

During calibration, the laser diode of a handle provides its light at an initial power setting. The tester measures the power of the light and reports the power to the handle. The handle may adjust the magnitude of the power provided by the laser diode and ask the tester for another reading as to how much power is being provided. The handle includes a photo diode. The photo diode may be packaged with the laser diode as an integrated unit (e.g., component). The light from the laser diode is detected by a photo diode. A current through the photo diode is related to the magnitude of the power of the light provided by the laser diode. The current through the photo diode flows through a resistor, so the voltage across the resistor is also related to the output power of the laser diode.

Because the tester is periodically calibrated using accurate measurement instruments, the tester accurately measures and reports the power of the light provided by the laser diode. So, when the tester reports that the magnitude of the power of the light provided by the laser diode is at or near the desired value, the handle knows that the laser is providing that amount of power. Further, the handle knows that the voltage across the resistor indicates that the laser diode is providing light at the desired power. The handle stores the value of the voltage across the resister as a golden voltage, because whenever the voltage across the resistor is equal to that value, the laser diode is providing the calibrated power of light.

A handle and a tester may cooperate to get a golden voltage for the output power of the diode for every region in the world. A golden voltage may be used by a handle to set the optical output of a laser diode while the CEW is being used in the field. The golden voltage used by the handle to set the optical output of the laser diode may be selected so that the laser diode provides the light power output appropriate for the region in which the CEW is operating.

A handle may communicate with a server, such as an evidence management server, to receive information regarding the maximum light power for the region in which the handle is being used. A handle may communicate with a server directly using any conventional communication protocol. A handle may communicate with a server via another electronic system such as a cell phone or a tablet.

System 100 creates an ecosystem for calibrating a handle of a CEW. System 100, also referred to as ecosystem 100 enables handle 110 to cooperate with tester 130 to calibrate handle 110. Ecosystem 100, shown in FIG. 1, may include handle 110, tester 130, communication link 140, communication link 170, network 150 and server 160.

As discussed above, a handle in cooperation with a deployment unit launches one or more electrodes to provide a current through a target to impede locomotion of the target.

A handle may operate a deployment unit to launch the electrodes of the deployment unit toward a target. A handle operates one or more laser diodes to illuminate a predicted point of impact of one or more electrodes on the target.

The ecosystem enables handle 110 to cooperate with tester 130 via communication link 140 to transfer data from light power meter 132. Ecosystem 100 further enables handle 110 to communicate via communication circuit 224 with server 160 over a communication link 170. One or more laser diodes may be coupled to handle 110 while handle 110 interacts with tester 130.

A handle may control a magnitude of the power of light provided by a laser diode. A handle may communicate with other devices in the ecosystem. A handle may detect physical properties (e.g., voltage, current, time). A handle may store data (e.g., information). A handle may provide a report. The information reported by a handle may include operating state and status of a deployment unit.

Handle 210 includes green laser 212, red laser 216, red laser 218, processing circuit 220, memory 222, communication circuit 224, bus 226, and signal generator 228.

The angle of the path of the light provided by red laser 216 differs from the path of the light from green laser 212 by eight degrees (8°). The angle of the path of the light provided by red laser 218 differs from the path of the light from green laser 212 by twelve degrees (12°). The path of the lights form the lasers and their relative angles corresponds to the predicted path of the electrodes of a deployment unit.

A laser diode is a semiconductor device that emits light. A laser diode emits a beam of coherent monochromatic light. A beam of light from a laser is spatially coherent thereby providing a narrow beam of light (e.g., collimated) that stays narrow for a distance. A laser diode includes an optical amplifier for generating the light. A laser may be used in a CEW to enhance targeting. A laser diode may be coupled to a CEW. The beam of light from the laser may be aligned with direction of travel of an electrode launched from the CEW.

The laser may indicate a location on a target of likely impact of the electrode. The light for a laser is visible during the day or at night. Since the light of a laser beam is highly collimated, the laser light appears as a small spot (e.g., dot) on a target even at long distances. A user may use the laser to perform the function of a sight for aiming. A user may aim the CEW to position the spot at a desired location on the target thereby aligning the likely direction of flight of the electrode to the spot on the target. The position of the spot on the target may not account for factors (e.g., electrode drop, windage) that may cause the electrode to diverge during flight. The laser beam provides an estimated location of impact of the electrode.

Many laser sights use a red laser diode. The green laser may be more visible than the red laser in bright lighting conditions because, for the same wattage, green light appears brighter to the human eye than red light.

A processing circuit includes any circuitry and/or electrical/electronic subsystem for performing a function. A processing circuit may include circuitry that performs (e.g., executes) a stored program. A processing circuit may include a digital signal processor, a microcontroller, a microprocessor, an application specific integrated circuit, a programmable logic device, logic circuitry, state machines, MEMS devices, signal conditioning circuitry, communication circuitry, a conventional computer (e.g., server), a conventional radio, a network appliance, data busses, address busses, and/or a combination thereof in any quantity suitable for performing a function and/or executing one or more stored programs.

A processing circuit may further include conventional passive electronic devices (e.g., resistors, capacitors, inductors) and/or active electronic devices (op amps, comparators, analog-to-digital converters, digital-to-analog converters, current sources, programmable logic). A processing circuit may include conventional data buses, output ports, input ports, timers, memory, and arithmetic units.

A processing circuit may provide and/or receive electrical signals whether digital and/or analog in form. A processing circuit may provide and/or receive digital information (e.g., data) via a conventional bus using any conventional protocol. A processing circuit may receive information, manipulate the received information, and provide the manipulated information. A processing circuit may store information and retrieve stored information. Information received, stored, and/or manipulated by the processing circuit may be used to perform a function and/or to perform a stored program.

A processing circuit may control the operation and/or function of other circuits and/or components of a system. A processing circuit may receive status information regarding the operation of other components (e.g., status, feedback). A processing circuit may perform calculations (e.g., operations) with respect to the status information. A processing circuit may provide commands to one or more other components in accordance with calculations. For example, a processing circuit request the status of a component, analyze the status, and command components to start operation, continue operation, alter operation, suspend operation, or cease operation. Commands and/or status may be communicated between a processing circuit and other circuits and/or components via any type of bus including any type of conventional data/address bus.

A processing circuit may generate a signal. A processing circuit may provide a signal to another component and/or circuit. A processing circuit may provide a signal having one or more characteristics (e.g., frequency, amplitude, pulse width, number of pulses, repetition rate of pulses). A processing circuit may provide a pulse width modulated ("PWM") signal. A processing circuit may alter one or more characteristics of a signal in accordance with the status of another component and/or circuit.

A computer-readable medium may store, retrieve, and/or organize data. Computer-readable medium includes any storage medium that is readable and/or writable by an electronic machine (e.g., computer, computing device, processor, processing circuit, transceiver). Storage medium includes any devices, materials, and/or structures used to place, keep, and retrieve data (e.g., information). A storage medium may be volatile or non-volatile. A storage medium may include any semiconductor medium (e.g., RAM, ROM, EPROM, Flash), magnetic medium (e.g., hard disk drive), medium optical technology (e.g., CD, DVD), or combination thereof. Computer-readable medium includes storage medium that is removable or non-removable from a system. Computer-readable medium may store any type of information, organized in any manner, and usable for any purpose such as computer readable instructions, data structures, program modules, or other data. A data store may be implemented using any conventional memory, such as ROM, RAM, Flash, or EPROM. A data store may be implemented using a hard drive.

A memory includes any digital circuitry for storing program instructions and/or data. Storage may be organized in any conventional manner (e.g., program code, buffer, circular buffer, data structure). Memory may be incorporated in and/or accessible by a transmitter, a receiver, a transceiver, a sensor, a controller, and a processing circuit.

A data store includes any suitable device configured to store data for access by an electronic machine. A data store receives data. A data store retains (e.g., stores) data. A data store retrieves data. A data store provides data for use by a system, such as an engine. A data store may organize data for storage. A data store may organize data as a database for storage and/or retrieval. The operations of organizing data for storage in or retrieval from a database of a data store may be performed by a data store. A data store may include a repository for persistently storing and managing collections of data. A data store may store files that are not organized in a database. Data in a data store may be stored in a computer-readable medium.

A communication circuit may transmit and/or receive information (e.g., data). A communication circuit may transmit and/or receive (e.g., communicate) information via a wireless link and/or a wired link. A communication circuit may communicate using wireless (e.g., radio, light, sound, vibrations) and/or wired (e.g., electrical, optical) mediums. A communication circuit may communicate using any wireless (e.g., Bluetooth, ZigBee, WAP, Wi-Fi, NFC, IrDA, GSM, GPRS, 3G, 4G) and/or wired (e.g., USB, RS-232, Firewire, Ethernet) communication protocols. Short-range wireless communication (e.g. Bluetooth, ZigBee, NFC, IrDA) may have a limited transmission range of approximately 20 cm-100 m. Long-range wireless communication (e.g. GSM, GPRS, 3G, 4G, LTE) may have a transmission ranges up to 15 km. A communication circuit may receive information from a processing circuit for transmission. A communication circuit may provide received information to a processing circuit.

A communication circuit may include a transmitter and a receiver. A communication circuit may further include a decoder and/or an encoder for encoding and decoding information in accordance with a communication protocol. A communication circuit may further include a processing circuit for coordinating the operation of the transmitter and/or receiver or for performing the functions of encoding and/or decoding.

A communication circuit in one system (e.g., vehicle computer) may communicate with a communication circuit in another system (e.g., equipment). Communications between two systems may permit the two systems to cooperate in performing a function of either system.

A communication link provides a medium for communication. A communication link may be suitable for a communication protocol. A communication link may be a conduit (e.g., channel) for communication between two systems.

Communication links 170 between handle 110 and server 160 and, network 150 may be any conventional communication link that communicates (e.g., transmit, receive) data using any conventional wired or wireless protocol.

Communication link 170 may be established as peer-to-peer links or links established via an access point or base station. Communication link 170 may be provided by short-range, lower power communication circuits (e.g., transceivers, transmitter, receiver). Communication link 170 may be provided by a longer-range, higher power communication circuit.

Preferably, communication link 170 is a high speed link for transferring large amounts of data to evidence management system (e.g. e.com) server 160.

A transceiver includes any circuitry for maintaining a communication link with one or more other transceivers. A transceiver may transmit and/or receive data via the communication link. Any conventional signaling technologies and communication technologies (e.g., protocols, standards, protocol stacks) may be used to establish and/or maintain the communication link. Any conventional signaling technologies and communication technologies may be used to transmit and/or receive data via the communication link. Integrated circuitry is preferred for small size and low power consumption. Programmable circuits using conventional program development technology may be used. To support one or more links, a transceiver may be coupled to a controller for complying with protocols, managing message buffers, and following communication logic (e.g., to retry when messages are not acknowledged, to join an ad hoc network).

A local area transceiver, as used herein, is a type of transceiver that employs relatively low power transmissions and relatively low sensitivity receivers to accomplish communication over one or more links. Each link may have a distance shorter than 6 feet (2 m). These short distance capabilities are useful for communications among electronics intended to be used in concert by one person. Higher power transmissions and relatively higher receiver sensitivity may be used where interference with other systems is otherwise unlikely.

A wide area transceiver, as used herein, is a type of transceiver as discussed above that employs relatively high power transmissions and relatively high sensitivity receivers to accomplish communication over one or more links. Each link may have a distance in the range of 10 feet (3 m) to 2000 feet (600 m).

A tester may detect (e.g., witness, discover) physical properties (e.g., intensive, extensive, isotropic, anisotropic). Physical properties include luminance. A tester may detect a physical property and/or a change in a physical property directly and/or indirectly. A tester may detect a quantity, a magnitude, and/or a change in a physical property. A detector may detect a physical property and/or a change in a physical property directly and/or indirectly. A tester may detect one or more physical properties and/or physical quantities at the same time or at least partially at the same time. A tester may deduce (e.g., infer, determine, calculate) information related to a physical property. A physical quantity may include an amount of time and an elapse of time.

A tester may transform a detected physical property to another physical property. A tester may transform (e.g., mathematical transformation) a detected physical quantity. A tester may relate a detected physical property and/or physical quantity to another physical property and/or physical quantity. A tester may detect one physical property and/or physical quantity and deduce another physical property and/or physical quantity.

A tester may include any circuit for detecting, transforming, relating, and deducing physical properties and/or physical quantities. For example, a tester may include a light detector. A tester may include a processing circuit for calculating, relating, and/or deducing. A processing circuit of a tester may determine luminous energy, luminous flux, luminous power, luminous intensity, and luminous energy density.

A tester may quantify and/or describe a physical property. A tester may provide a report regarding a physical property.

For example, tester 130 includes light power meter 132, computer 136, and bus 134. Handle 110 may cooperate with tester 130 to measure the magnitude of the energy of the light provided by one or more laser diodes in handle 110. A laser diode of handle 110 may provide a beam of light to tester 130. Tester 130 may measure the magnitude of the power of the light provided by the laser diode. Tester 130 may report the detected power of the laser light to handle 110 via communication link 140.

Tester 130 may measure the instantaneous and/or average power of the light provided by a laser diode of handle 110. Tester 130 may report the instantaneous and/or average power of the light to handle 110. Handle 110 may coordinate its operation with tester 130 to provide light for measurement by tester 130. Handle 110 may cooperate with tester 130 so that handle 110 may calibrate the light power output of a laser diode of handle 110. Handle 110 may control (e.g., initiate, terminate, continue, repeat) the operation of tester 130 to detect, measure, and/or report the magnitude of the power of the light provided by a laser diode of handle 110. Responsive to reports from tester 130, handle 110 may calibrate the light power output of a laser diode of handle 110.

A light power meter may detect a light. A light power meter may measure a magnitude of the power of a light. A light power meter may measure a magnitude of an average power of a light. A light power meter may report the magnitude of the power of detected light. A light power meter may provide information about light power measurements to a computer.

A computer includes any electronic machine as discussed above. A computer may include a conventional computer. A computer may control the operation of tester 130. A computer may communicate with light power meter 132 via bus 134. Computer 136 may receive information about light power measurements performed by light power meter 132. Computer 136 may control the operation of light power meter 132. A computer may communicate with handle 110 with a communication circuit. A computer may send messages to and receive messages from handle 110.

Bus 134 may include any conventional bus (e.g. UART, SPI, I2C, or USB).

A server may store information related to one or more regions, and/or information related to one or more agencies (e.g., security agency, police agency).

A server may receive information. A server may process (e.g., calculate, transform) information. A server may provide information. A server may provide transformed information. A server may communicate with other electronic systems. A server may communicate with other electronic systems via a network.

A server may receive and/or determine a geographic location of a weapon. A server may have information regarding the region where a particular CEW is located. A server may relate the geographic location of a weapon to a region where the weapon is located. A server may have information regarding the maximum output power permitted by a laser diode in a region. A server may determine a maximum power output of a laser diode for a region. A server may inform a weapon of the maximum power output for the laser diode of the weapon in accordance with the region where the weapon is located. A server may prepare and/or provide a report. A server may report the region of a weapon. A server may report the maximum power output assigned by the server to a weapon.

Ecosystem 100 further enables handle 110 to communicate via communication circuit 124 with server 160 over a communication link 170. A CEW may provide information to a server. Information that a CEW provides to a server may include the geographic location of the CEW and/or the identifier of the CEW. A CEW may receive information from a server. A CEW may perform an operation in response to the information received from a server. A CEW may conform (e.g., set) the output power of a laser diode of the CEW responsive to information received from a server.

For example, server 160 performs the functions of a server discussed above. Server 160 may include region engine 166, agency data store 168, region data store 164, and network interface 162.

An engine may perform one or more operations of a server. An engine may perform one or more functions or a single function. An engine may access stored data to perform an operation and/or function. An engine may generate (e.g., produce) data for storage.

The term "engine" as used herein refers to, in general, circuitry, logic embodied in hardware and/or software instructions executable by a processor of a computing device. Circuitry includes any circuit and/or electrical/electronic subsystem for performing a function. Logic embedded in hardware includes any circuitry that performs a predetermined operation or predetermined sequence of operations. Examples of logic embedded in hardware include standard logic gates, application specific integrated circuits ("ASICs"), field-programmable gate arrays ("FPGAs"), microcell arrays, programmable logic arrays ("PLAs"), programmable array logic ("PALs"), complex programmable logic devices ("CPLDs"), erasable programmable logic devices ("EPLDs"), and programmable logic controllers ("PLCs"). Logic embodied in (e.g., implemented as) software instructions may be written in any programming language, including but not limited to C, C++, COBOL, JAVA™, PHP, Perl, HTML, CSS, JavaScript, VBScript, ASPX, HDL, and/or Microsoft .NET™ programming languages such as C#. The software for an engine may be compiled into an executable program or written in an interpreted programming language for execution by a suitable interpreter or virtual machine executed by a processing circuit. Engines may be callable (e.g., executable, controllable) from other engines or from themselves.

Generally, the engines described herein can be merged with other engines, other applications, or may be divided into sub-engines. Engines that are implemented as logic embedded in software may be stored in any type of computer-readable medium. An engine may be stored on and executed by one or more general purpose computers, thereby creating a special purpose computer configured to perform the functions of (e.g., provide) the engine.

The devices and systems illustrated herein may include one or more computing devices configured to perform the functions of an engine, though the computing devices themselves have not been illustrated in every case for the sake of clarity. An example of a computing device is provided below.

Region engine 166 may perform the functions of an engine as discussed above. Region engine 166 may access information from agency data store 168 and/or region data store 164. Region engine 166 may store data in agency data store 168 and/or region data store 164. Region engine 166 may receive and/or determine a geographic location of a weapon. Region engine 166 may determine a region in which a weapon is located. Region engine 166 may relate the geographic location of a weapon to a region where the weapon is located. Region engine 166 may determine a maximum power output of a laser diode of the weapon in accordance with the region where the weapon is located. Region engine 166 may transmit information to a weapon, directly or indirectly. Region engine 166 may receive information from a weapon, directly or indirectly. Region engine 166 may cooperate with network interface 162 to communicate with a weapon. Region engine 166 may inform a weapon of the region in which the weapon is located. Region engine 166 may inform a weapon of the maximum permissible power output of the light from a laser diode of the weapon for the region in which the weapon is located.

Region engine 166 may provide a report. Region engine 166 may provide a report to an agency. Region engine 166 may report the region of a weapon. Region engine 166 may report the maximum power output assigned by the server to a weapon.

Region engine 166 may be implemented using a computing device.

As understood by one of ordinary skill in the art, a "data store" as described herein may be any suitable device configured to store data for access by a computing device. A data store receives data. A data store retains (e.g., stores) data. A data store retrieves data. A data store provides data for use by a system, such as an engine. A data store may organize data for storage. A data store may organize data as a database for storage and/or retrieval. The operations of organizing data for storage in or retrieval from a database of a data store may be performed by a data store. A data store may include a repository for persistently storing and managing collections of data. A data store may store files that are not organized in a database. Data in a data store may be stored in a computer-readable medium.

One example of a data store suitable for use with the high capacity needs of a server is a highly reliable, high-speed relational database management system ("RDBMS") executing on one or more computing devices and accessible over a high-speed network. However, any other suitable storage technique and/or device capable of quickly and reliably providing the stored data in response to queries may be used, such as a key-value store and an object database.

A data store may be implemented using any computer-readable medium.

For example, agency data store 168 may receive and store information related to one or more agencies. Information related to an agency may include weapons owned and/or controlled by the agency, weapons deployed by an agency, identifiers (e.g., serial numbers) of weapons owned and/or controlled by an agency, geographic location of an agency, geographic extent of service of an agency, geographic location of deployment of a weapon, and/or selected power output of the laser diode of the weapon.

Region data store 164 may receive and store information related to one or more regions. Information related to a region may include a geographic location of the region, GPS coordinates of the boundaries of a region, GPS coordinates of particular locations in a region, a maximum power output of light from a laser diode permitted in the region, and/or frequencies of laser lights permitted in the region.

A network interface enables a system or a computing device, as discussed below, to communicate with other devices and/or systems over a network. The functions of a network interface may be performed by circuits, logic embedded in hardware, software instructions executable by a processor, or any combination thereof. The functions performed by a network interface enable a computing device to communicate with another device. The functions performed by a network interface, whether using hardware or software executed by a processor, may be referred to as services. A device may request the services of a communication interface to communicate with a computing device.

A network interface may communicate via wireless medium and/or a wired medium. A network interface may include circuits, logic embedded in hardware, or software instructions executable by a processor (e.g., wireless network interface) for wireless communication. A network interface may include circuits, logic embedded in hardware, or software instructions executable by a processor (e.g., wired network interface) for wired communication. The circuits, logic embedded in hardware, or software used for a wireless network interface may be the same in whole or in part as the circuits, logic embedded in hardware, or software used for a wired network interface. A network interface may communicate using any conventional wired (e.g., LAN, internet) or wireless communication (e.g., Bluetooth, Bluetooth Low Energy, Wi-Fi, ZigBee, 2G, 3G, LTE, WiMAX) protocol.

A network enables electronic systems to exchange data (e.g., information). A network may include nodes. A communication link (e.g., data link) permits the transfer of information between nodes of the network. A node of a network may include a server and/or a handle. A server and/or a handle may communicate (e.g., transmit, receive) via other nodes and communication links of the network.

An electronic system may send or receive data. An electronic system may be a node in a network. An electronic system may be stationary or portable. An electronic system may present information on a display of the electronic system. An electronic device may receive information from a user via a user interface. An electronic system may perform calculations and/or analyze data. An electronic system may perform a calculation and/or analyze data and provide (e.g., transmit) the result to another system. An electronic system may communicate with other systems via a wired or wireless connection. An electronic device may include a smart phone carried by a user. An electronic system may include a tablet, a computer, and/or a mobile data terminal in a vehicle. An electronic system may operate as an intermediary between a CEW and a node of the network, such as a server.

Setting the power of the light provided by a laser diode may be accomplished by setting the operating point of the laser diode. The operating point of a laser diode refers to the point on a characteristic curve where the laser diode operates. A characteristic curve of a laser diode relates the magnitude of the power of light provided by the laser diode to the current through (e.g., drawn by) the laser diode.

Characteristic curve 310 of an example laser diode shows the relationship between the current that flows through the laser diode (x-axis) and the power of the light provided by the laser diode (y-axis). Characteristic curve 310 shows the relationship between the light power output and the current of the laser diode at 25 degrees Celsius. The relationship between light power and current is temperature dependent. The temperature dependence of a laser diode is discussed below.

An operating point of the laser diode is defined as a point on characteristic curve 310. The point of characteristic curve 310 identifies the light power for the current. For example, at operating point 320, the current through the example laser diode is 58 milliamps ("mA"). While the laser diode operates at 25 degrees Celsius and a current of 58 mA flows through the laser diode, the power of the light provided by the laser diode is 5 milliwatts ("mW"). While the laser diode operates at operating point 330, the current through the laser diode is 65 mA and the power of the light provided by the diode is 10 mW.

The operating point of a laser diode may be set by a circuit. A circuit for setting the operating point of a laser diode may include circuitry for establishing a voltage across the laser diode. A circuit for setting the operating point of a laser diode may include a processing circuit. A processing circuit may set, at least in part, the operating point of a laser diode. A circuit for setting the operating point of a laser diode may include a feedback circuit. A processing circuit may detect feedback from a circuit for setting an operating point. A processing circuit may perform a function in accordance with feedback. An operating circuit may set an operating point of a laser diode at least in part in accordance with feedback from a circuit for setting the operating point of a laser diode.

Circuit 400 is an example of a circuit that sets the operating point of a laser diode and detects the magnitude of output power of the light of the laser diode. Circuit 400 performs the functions of a circuit that sets the operating point of a diode as discussed above. Circuit 400 performs the functions of a detector circuit discussed herein. Circuit 400 includes processing circuit 220, operating point circuit 430, and detector circuit 460. Processing circuit 220 performs the functions of a processing circuit discussed above.

An operating point circuit sets the current that flows through a laser diode. An operating point circuit sets an operating point of a laser diode. An operating point circuit may be controlled, at least in part by a processing circuit. A processing circuit may provide a signal to an operating point circuit. An operating point circuit may set the operating point of a laser diode in response to the signal from the processing circuit. A signal from a processing circuit may include a pulse-width modulate ("PWM") signal. An operating point of a laser diode may relate to a duty cycle of a PWM signal.

Duty cycle describes the ratio or proportion of on time or pulse width to the total period of the PWM signal. A low duty cycle corresponds to a short pulse width. A PWM signal may be used to control the power supplied to an electronic device. The average value of the voltage or current provided to the electronic device is determined by the amount of time the electronic device is turn on to the amount of time it is turned off. The longer the electronic device is on compared to the off periods, the higher the total power supplied to the electronic device. A PWM signal may control a switch to control the voltage or current provided to the electronic device. The duty cycle of the PWM signal determines the voltage or the current supplied to the electronic device, which in turn determines the average power provided to the device.

For example, operating point circuit may include transistor 434, inductor 432, diode 436, capacitor 438, and laser diode 450. Processing circuit 220 sets the operating point of laser diode 450 by controlling the voltage on node 440. The operating point of laser diode 450 determines the magnitude of the power of the light provided by the laser diode 450 as discussed above.

In example circuit 400, processing circuit 220 provides a PWM signal to node 480. Node 480 drives the gate of transistor 434. Transistor 434, inductor 432, and diode 436 perform the function of a boost converter that provides the voltage across laser diode 450 which determines the current that flows through laser diode 450. The output of the boost converter drives node 440. The output voltage of the boost converter at node 440 is related to the duty cycle of the PWM signal on node 480. Processing circuit 220 may increase or decrease the output voltage of the boost converter on node 440 by increasing or decreasing respectively the duty cycle of signal 480.

Figure 5:
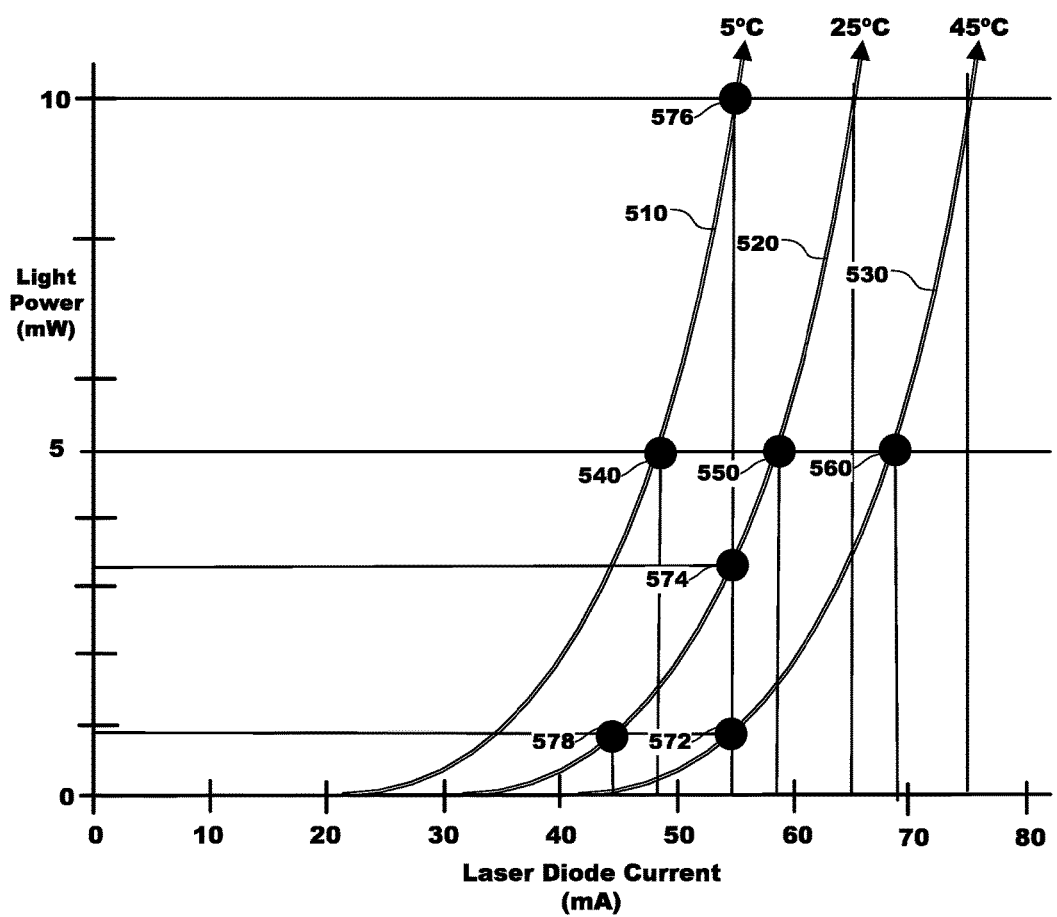
FIG. 5 is another diagram of the power vs. the current characteristic curves for a hypothetical laser diode for multiple temperatures of the laser diode.

A processing circuit may set the output power of the light of a laser diode by using a circuit to set the operating point of the laser diode as discussed above. The operating point of a laser diode is temperature dependent. Characteristic curves of an example laser diode as a function of temperature are shown in FIG. 5. Characteristic curves 510, 520, and 530 show the relationship between the power output of the light of a laser diode (y-axis) and the current of the laser diode (x-axis) at 5, 25, and 45 degrees Celsius respectively. Characteristic curves 510, 520, and 530 show that for a given current through the laser diode, the output power of the light increases as the temperature decreases and vice versa. For example, if the current through the laser diode is 55 mA, the power output at 45, 25, and 5 degrees Celsius is about 1 mW, 3 mW, and 10 mW and the diode operates at operating points 572, 574, and 576 respectively.

The effect of temperature may also be assessed from the perspective of maintaining a particular output power over temperature. To maintain an output power of about 5 mW, the current through the laser diode would need to be 48 mA, 58 mA, and 69 mA at 5, 25, and 45 degrees Celsius respectively. In other words, to maintain about the same output power of the laser diode, the amount of current through the diode would need to be increased as the temperature increases and vice versa. For example, at 5, 25, and 45 degrees Celsius respectively the current through the diode to provide output power of about 5 mW is 48 mA (operating point 540), 58 mA (operating point 550), and 69 mA (operating point 560) respectively.

A detector circuit detects the magnitude of output power of the light from a laser diode. A detector circuit may provide a signal that is related to the magnitude of output power of the light from the laser diode. A signal may include a voltage and/or a current. A detector circuit may provide the signal to a processing circuit. A detector circuit may be temperature insensitive.

The operating point of a laser diode may be adjusted responsive to temperature. The operating point of a laser diode may be adjusted to maintain about the same current through the laser diode over temperature. The operating point of a laser diode may be adjusted to maintain about the same output power of light from the laser diode over temperature. The operating point of the laser diode may be adjusted responsive to detecting. A processing circuit may use a signal from a detector circuit for adjusting an operating point of a laser diode. Operating point circuit 430 may set the operating point of a laser diode as discussed above.

A processing circuit may cooperate with a tester to relate (e.g., associate) a magnitude of an output voltage of a detector circuit to a measured magnitude of output power of the light provided by the laser diode. The process of relating a magnitude of an output voltage from a detector circuit to a measured magnitude of output power of light may be referred to as calibrating the output power of the light from the laser diode.

During calibration, a processing circuit may cooperate with a tester to calibrate the output power of the light from the laser diode. A processing circuit may set the operating point for a laser diode. At the operating point for the temperature of the laser diode, the laser diode provides a light having a magnitude of power. The tester may measure the magnitude of the power of the light provided by the laser diode. A processing circuit may receive a message from a tester that reports the magnitude of the output power of the light from the laser diode. A processing circuit may measure the magnitude of the output voltage from the detector circuit. A processing circuit may relate the reported magnitude of output power of the light to the magnitude of the voltage from the detector circuit.

For a detector circuit that is temperature insensitive, each time the laser diode provides light at a particular magnitude of power, the magnitude of the output voltage of the detector circuit will be about the same regardless of temperature. For example, suppose that the temperature of the laser diode is about 45 degrees Celsius and the processing circuit sets the current through the laser diode to be about 55 mA so that the laser diode operates at operating point 572. At operating point 572, suppose that the output voltage of the detector is V1.

Now suppose that the temperature drops to 25 degrees Celsius so that the operating point of the laser diode moves to operating point 574. The magnitude of the output power of the light from the laser diode is now about 3 mW. Since the operation of the detector circuit is temperature insensitive, the detector circuit will accurately detect the magnitude of output power, but since the magnitude of output power has increased, the voltage output from the detector circuit will no longer be V1 because the voltage V1 is produced each time the magnitude of output power of the laser diode is 1 mW. At 25 degrees Celsius, the processing circuit will need to adjust the current through the laser diode to be about 46 mA, operating point 578, so that the magnitude of output power is about 1 mW. At 25 degrees Celsius, if the processing circuit adjusts the operating point of the laser diode to be operating point 578, the detector circuit will detect the magnitude of output power of the light from the laser diode, now about 1 mW, and the output voltage from the detector circuit will be V1.

Circuit 460 is an example of a detector circuit. Detector circuit 460 includes photo detector 462, capacitor 466, and resistor 464.

Photo detector 462 detects the light provided by laser diode 450. The light from laser diode 450 causes a current to flow through photo detector 462. The current through photo detector 462 is related to the magnitude of the power of the light received by photo detector 462.

The current that flows through photo detector 462 also flows through resistor 464. The voltage across resistor 464 is the voltage at node 470. Processing circuit 220 may measure (e.g., detect, sample) the magnitude of voltage at node 470. The voltage on node 470 is referred to herein as the output voltage of the detector circuit.

Capacitor 466 cooperates with resistor 464 to form an RC circuit having a time constant. The time constant of the RC circuit may be larger than the period of the PWM signal provided by processing circuit 220 at node 480. The time constant of the RC circuit may be an order of magnitude greater than the period of the PWM signal. The RC circuit reduces the voltage ripple on node 470 that may be induced by the modulated signal on node 480.

Because the current induced by the magnitude of light detected by photo detector 462 is insensitive to temperature, the current provided by photo detector 462 will be related to the magnitude of the power of light provided by laser diode 450 regardless of the operating temperature of laser diode 450.

Since the current through photo detector 462 is related to the magnitude of the power of the light from laser diode 450 and flows through resistor 464, the voltage across resistor 464 is related to the magnitude of the power of the light from laser diode 450.

The voltage across resistor 464, voltage at node 470, is the output voltage of the detector circuit measured the processing circuit 220. Processing circuit 220 sets the magnitude of the power of light provided by laser diode 450 responsive to monitoring the output voltage of the detector circuit. As the magnitude of the light power from laser diode 450 varies over temperature, processing circuit 220 may detect the changes and adjust the PWM duty cycle of the operating point circuit to maintain the magnitude of the power of the light provided by laser diode 450 at a desired value.

A processing circuit may set the operating point of a laser diode to provide a predetermined magnitude of power of light or a predetermined range of magnitude of power of light. A predetermined magnitude of power of light is referred to herein as a predetermined power. A predetermined range of magnitude of power of light is referred to herein as a predetermined range. A predetermined power or a predetermined range may relate to a maximum power of light for a region.

A predetermined power or range may be included in the stored program executed by a processing circuit or stored in a memory. A predetermined power or range may be provided to a processing circuit by the tester during calibration and stored in a memory of a handle. A predetermined power or range may be provided to a processing circuit by a server and stored in a memory of a handle. A predetermined power or range may be provided to a processing circuit and/or updated by any combination of the above. The initial and/or updated values for a predetermined power or range may be stored in a memory for use by a handle during calibration of the handle or operation of the handle in the field. A predetermined power or range may include values for all regions of operation of any handle.

During calibration, a processing circuit of a handle retrieves a value, as discussed above, of a predetermined power. The processing circuit sets an initial operating point of the laser diode and thereby sets an initial magnitude of the power of the light provided by a laser diode. The laser diode provides the light to the tester. The processing circuit receives a message from the tester that reports the magnitude of the power of light as measured by the tester. The processing circuit compares the magnitude of the power of light as measured by the tester to a predetermined power. The processing circuit adjusts the operating point of the laser diode responsive to comparing. The tester measures the magnitude of the power of light and provides another report to the handle. The processing circuit repeats, adjusting, receiving a report, and comparing until the magnitude of the power of light measured by the tester is about the same as the predetermined power.

When the processing circuit receives a report from the tester that the magnitude of the power of the light provided by the laser diode is at or near the predetermined power, the handle knows that the laser diode is providing light at the magnitude of the predetermined power. Further, the processing circuit knows that the magnitude of the output voltage from the detector circuit (e.g., the voltage at node 470) relates to the predetermined power. Once the magnitude of the power of the light provided by the laser diode is about the same as the predetermined power, the processing circuit stores in memory the value of the magnitude of the output voltage of the detector circuit as a golden voltage. The term "golden voltage" means that whenever the output voltage of the detector circuit is equal to golden voltage, the laser diode is providing a calibrated magnitude of power of light. The processing circuit associates that golden voltage to a specific predetermined power.

A processing circuit may determine the upper and lower golden voltage of a predetermined range using the calibration method discussed above.

A golden voltage determined during calibration may be used by a processing circuit to set the magnitude of the power of light from a laser diode while the CEW is being used in the field. A golden voltage may be used by a processing circuit to set the magnitude of the power of light from a laser diode so that the laser diode provides the predetermined power or power within the predetermined range for the region in which the CEW is operating.

A golden voltage may be used to maintain the magnitude of the power of light from a laser diode to be about the same as the predetermined power or within the predetermined range for the region over variations in temperature of the laser diode.

The magnitude of the power of light from a laser diode is about the same as a predetermined power when the magnitude of the power of the light from the laser diode is the same as the predetermined power or lies within the range of the predetermined power minus 10 percent (10%) of the predetermined power. For example, if the predetermined power is 5 mW, the magnitude of the power of light from a laser diode is about the same if the magnitude of the power of light from the laser diode is between 4.5 mW and 5 mW.

The magnitude of the power of light from a laser diode is about the same as an upper value of a predetermined range when the magnitude of the power of light from a laser diode is the same as the upper value of the predetermined range or lies within the range of the upper value of the predetermined range minus 10 percent (10%) of the upper value of the predetermined range. The same applies to the lower value of a predetermined range.

Because the predetermined power and the predetermined range of one region may be different from the predetermined power and the predetermined range of another region, a handle may be calibrated to determine and store one or more golden voltages for one or more regions. Table 1 below identifies predetermined power for three different regions. Table 2 below identifies predetermined power ranges for three different regions. The values of the golden voltages may be different for each handle due to variations in components of different handles such as the laser diode.

TABLE 1

Examples of Predetermined Power and Golden Voltages for Regions

| Region | Predetermined Power | Golden Voltage for Predetermined Power | Golden Voltage for Predetermined Power minus 10 percent |
|---|---|---|---|
| 1 | 5 mW | V1P | V1Pm10 |
| 2 | 3 mW | V2P | V2Pm10 |
| 3 | 1 mW | V3P | V3Pm10 |

The golden voltage for the predetermined power minus 10 percent (e.g., V1Pm10, V2Pm10, V3Pm10) may be measured during calibration and stored in the memory of the handle for use when setting the power of light of the laser diode in the field or it may be calculated using information that relates the current through photo detector 462 and the magnitude of the power of light detected.

TABLE 2

Examples of Predetermined ranges and Golden Voltages for Regions

| Region | Predetermined Range | Golden Voltage for Lower Value of Predetermined Range | Golden Voltage for Upper Value of Predetermined Range |
|---|---|---|---|
| 1 | 3-5 mW | V1L | V1U |
| 2 | 1-3 mW | V2L | V2U |
| 3 | 0.5-1 mW | V3L | V3U |

When a range is specified for the output power of light for a region, a golden voltage for an upper value and a lower value is determined during calibration. For a particular handle, the values for V1L, V1U, V2L, V2U, and V3U may be V2P, V1P, V3P, V2P, V3P respectively from Table 1 because the magnitude of the power of the light from the laser diode is the same.

For example, handle 110 cooperates with tester 130 and possibly server 160 to calibrate the magnitude of the power of light from the laser diode to be about the same as a predetermined power of 5 mW. Handle 210 is an example implementation of handle 110. Circuits (e.g. 212, 216, 218, 222, 224) of handle 210 may be controlled, in whole or in part, by processing circuit 220 to calibrate the magnitude of the power of light provided by green laser 212, red laser 216, and/or red laser 218. Circuits 430 and 460 combined are an example implementation of green laser 212. Processing circuit 220 and circuits 430 and 460 cooperate with tester 130 to calibrate the magnitude of the power of light from green laser 212.

Figure 6:
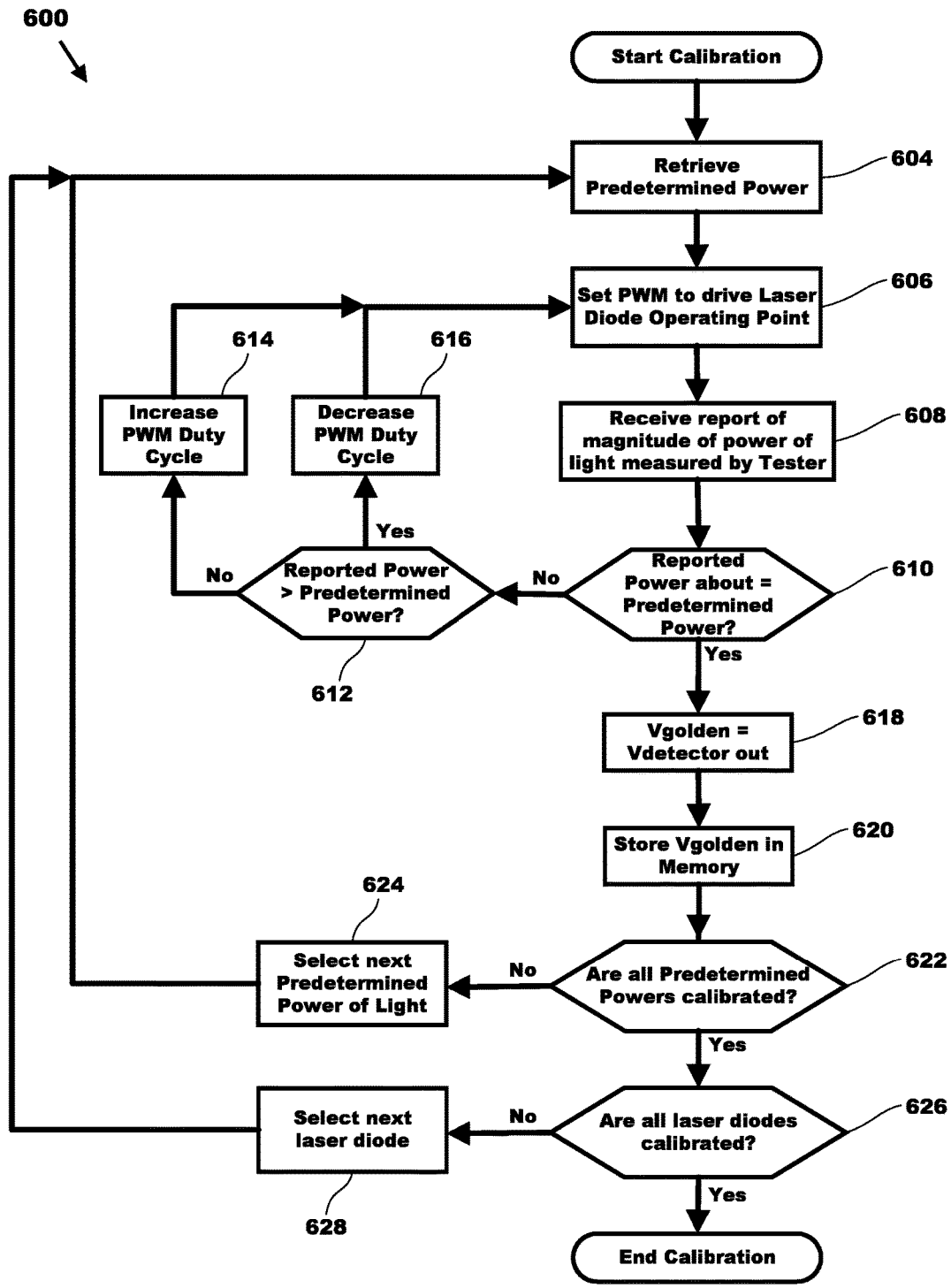
FIG. 6 is a flow chart of a method for calibrating the magnitude of the power of light of a laser diode in a CEW.

During calibration, processing circuit 220 of handle 210 may perform the example method shown in FIG. 6. To start calibration, processing circuit 220 selects a predetermined power from memory 222. As discussed above, processing circuit 220 may receive and store one or more predetermined powers during manufacture, from tester 130 and/or from server 160.

In this example, processing circuit 220 in step 604 selects the predetermined power for the U.S. region of operation. The maximum magnitude of the power of light for a laser diode in the U.S. is limited to 5 mW. As an additional safeguard, the predetermined power for the U.S. may be specified to be 4.9 mW to ensure that the magnitude of the power of light from a laser diode does not exceed the 5 mW limit.

In step 606, processing circuit 220 sets the value of the duty cycle of a PWM signal to an initial duty cycle and sends the PWM signal to node 480 to set the initial operating point of laser diode 450 and accordingly set an initial magnitude of the power of light of laser diode 450.

Tester 130 detects the light from laser diode 450 and measures the magnitude of the power of the light from laser diode 450. Processing circuit 220 may control tester 130, in whole or part, so that the tester knows when to detect, measure, and/or report the magnitude of the power of light measured. After measuring the magnitude of the power of light from laser diode 450, tester 130 may send a message to processing circuit 220 to report the magnitude of the power of light measured by tester 130. Tester 130 may detect, measure, and/or report an instantaneous and/or average power of the magnitude of light provided by laser diode 450.

In step 608, processing circuit 220 receives the message from tester 130. When processing circuit 220 receives the message, processing circuit 220 compares the measure magnitude of power to the value retrieved from memory 222. Suppose that value reported by tester is 4.3 mW.

In step 610, processing circuit 220 compares the value from the tester (e.g., 4.3 mW) to the value from memory 222 (e.g., 4.9 mW) and determines that the magnitude of the power of light from laser diode 450 is not about equal to 4.9 mW.

Because the magnitude of light provided by laser diode 450 is not about equal to the predetermined power, control passes to step 612. In step 612, processing circuit 220 determines that the measured power from tester 130 is not greater than the predetermined power of 4.9 mW, so control passes to step 614. If the measured magnitude of light provided from laser diode 450 had been greater than the predetermined power, say 5.0 mW, control would pass to step 616.

In step 614, processing circuit 220 increases the duty cycle of the PWM signal impressed on node 480. Increasing the duty cycle of the PWM signal increases the current that flows through laser diode 450 thereby increasing the magnitude of light provided by laser diode 450.

In step 616, processing circuit 220 decreases the duty cycle of the PWM signal impressed on node 480. Decreasing the cycle of the PWM signal decreases the current that flows through laser diode 450 thereby decreasing the magnitude of light provided by laser diode 450.

Processing circuit 220 repeats steps 606 through 616 until step 610 determines that the magnitude of the power of light provided by laser diode 450 as reported by tester 130 is about the same as the predetermined power. In this example, the predetermined power is 4.9 mW, so the magnitude of light provided by laser diode 450 is about the same as the predetermined power if the magnitude of light provided by laser diode 450 lies within the range of 4.41 mW-4.9 mW.

Once the magnitude of light provided by laser diode 450 as measured by tester 130 is about the same as the predetermined power, control moves to step 618.

In step 618, processing circuit 220 measures the magnitude of the voltage at node 470. The magnitude of the voltage measured may be for example 1.51V. The value of the measured voltage is the golden voltage for the U.S. predetermined power.

In step 620, Processing circuit 220 saves value 1.51V in memory 222 and associates the value 1.51 V to the predetermined power for the U.S. region. Because the magnitude of light provided by laser diode 450 has been measured by tester 130 to be about equal to the predetermined power, processing circuit 220 knows that each time the magnitude of the voltage at node 470 is about 1.51V that the magnitude of the power of the light provided by laser diode 450 is about 4.9 mW.

Processing circuit 220 executes steps 622 and 624 to repeat steps 604 through 620 for each predetermined power and upper and/or lower range of a predetermined range for each region where the laser diode may operate.

Because handle 210 includes more than one laser diode and each laser diode needs to be calibrated separately, processing circuit 220 executes steps 626 and 628 to determine whether steps 604-622 need to be repeated for another laser diode, for example red laser 216 and/or red laser 218.

When calibration is complete, processing circuit 220 has determined the predetermined power and possibly predetermined range for each laser diode of handle 210 for each region where handle 210 may operate in the field. As a result of calibration, a golden voltage has been determined for each predetermined power and possibly the upper and lower values for each predetermined range for all regions where handle 210 may operate in the field. The golden voltages have been stored in memory 222 for use in the field to set and maintain the magnitude of the power of light from the laser diodes of handle 210 over temperature in any region.

A CEW may deliver a current to impede locomotion of a human or animal target when launched electrodes attach to the target. Electrode placement on a target (e.g., targeting) is aided by illumination by a laser diode of the predicted points of impact of the electrodes. Providing light from the laser diodes of a handle about equal to the predetermined power for the region increases the visibility of the light from the laser diodes and improves an operator's ability to target.

A server may contain information regarding the operating region of the handle. A server may contain information regarding the maximum magnitude of the power of light approved for a region and/or a range of the magnitude of the power of light for a region of operation.

A processing circuit of a handle may receive information regarding the operating region of the handle. A processing circuit of a handle may receive information regarding the maximum magnitude of the power of light allowed for a region of operation. A handle may store information received from a server for use during field operation. A processing circuit may correlate the maximum power of light for the region of operation to a calibrated golden voltage.

When a laser diode of a CEW is turned on in the field, a processing circuit may retrieve from memory the golden voltage appropriate for the region of operation. The processing circuit sets an initial operating point of the laser diode by providing a PWM signal at a duty cycle to the laser diode operating point circuit. The processing circuit measures the output voltage of the detector circuit and compares it to the appropriate golden voltage for the region. The processing circuit adjusts the duty cycle of the PWM signal and thereby the operating point of the laser diode responsive to the comparison. The processing circuit repeats adjusting the duty cycle of the PWM signal and comparing the output voltage of the detector circuit to the golden voltage until the output voltage of the detector circuit is about the same as the golden voltage.

When the output voltage of the detector circuit is at or about the golden voltage, the magnitude of the power of light of the laser diode is at the predetermined power for that region. In the case where a region of operation of a handle is unknown, the processing circuit defaults to using the predetermined power and/or predetermined range of the region with the lowest maximum output power.

For example, when handle 210 is powered on in the field, processing circuit 220 sets the operation point of each laser diode and thereby the magnitude of power of light provided by each laser diode. Circuits (e.g. 212, 216, 218, 222, 224) of handle 210 may be controlled, in whole or in part, by processing circuit 220 to adjust the magnitude of the power of light provided by green laser 212, red laser 216, and/or red laser 218. Circuits 430 and 460 combined are an example implementation of green laser 212. Processing circuit 220 may adjust signals (e.g., 480) to circuits 430 and 460 to adjust the magnitude of the power of light from green laser 212.

Figure 7:
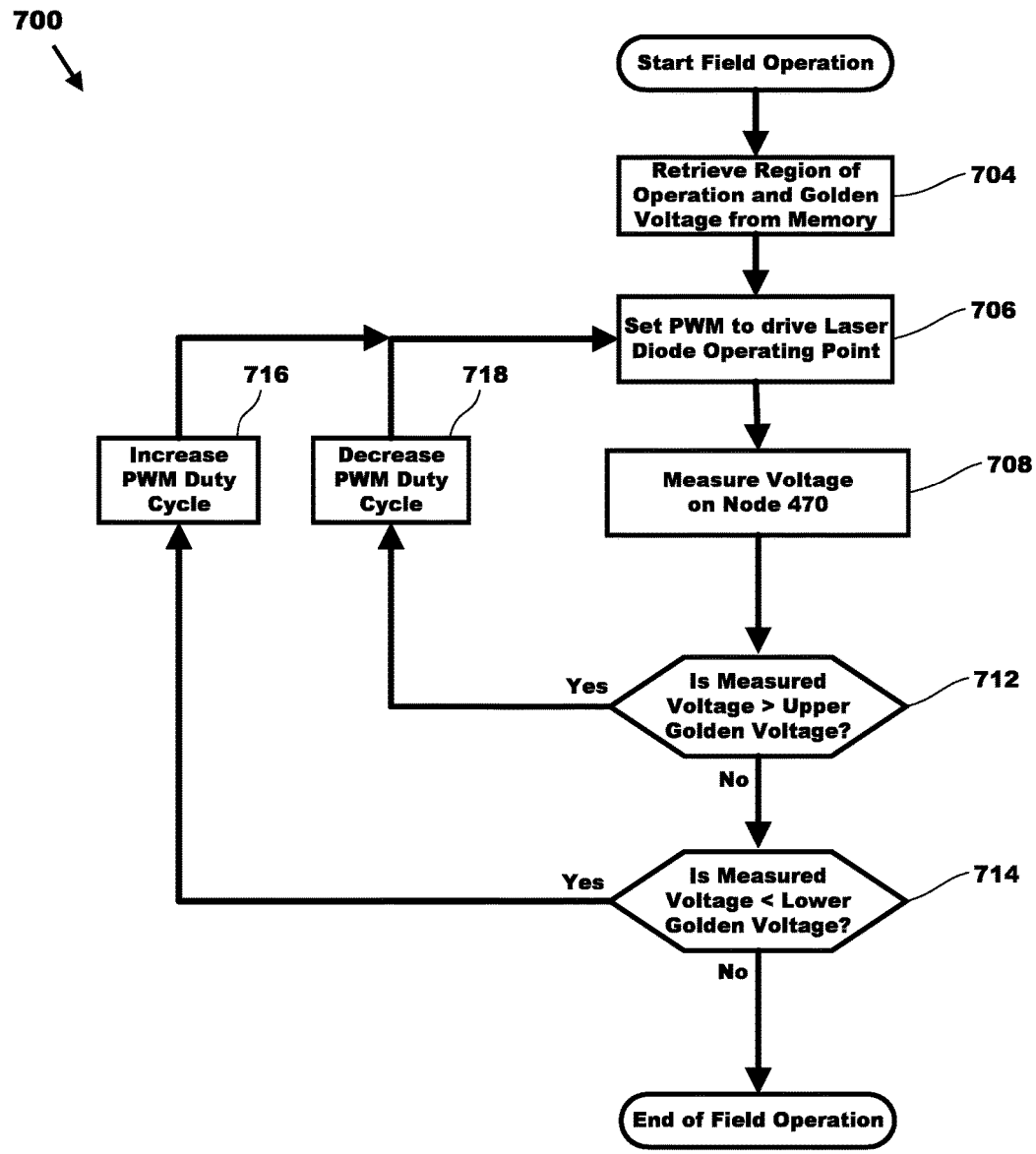
FIG. 7 is a flow chart of a method for adjusting the magnitude of the power of light of a laser diode, after calibration.

During field operation, processing circuit 220 of handle 210 may perform the example method shown in FIG. 7. To start laser diode operation, processing circuit 220 selects a golden voltage associated with the region of operation from memory 222. As discussed above, processing circuit 220 has previously stored golden voltages during calibration.

In this example, processing circuit 220 in step 704 retrieves from memory 222 the golden voltage or a range of golden voltages for the region of operation of handle 210. Processing circuit 220 may also retrieve information regarding the region of operation then use the region information to retrieve the golden voltage or golden voltage range.

With reference to Tables 1 and 2 above, the golden voltage retrieved from memory 222 may be a single value or two values that represent a range of values of the golden voltage. With reference to Table 1, processing circuit 220 may retrieve a single value for a golden voltage (e.g., V1P, V2P, V3P) then calculate the lower value of the golden voltage (e.g., V1Pm10, V2Pm10, V3Pm10) so that the power of light that is provided by the laser diode is about the same as the predetermined value for the region as defined above. For this example method 700, assume that memory 222 stores a single golden voltage for the region of operation (referred to as upper golden voltage), for example 1.51V, and processing circuit 220 calculates a voltage that represents the predetermined power minus 10 percent (referred to as lower golden voltage), in this example 1.43V.

In step 706, processing circuit 220 sets the value of the duty cycle of a PWM signal to an initial duty cycle and sends the PWM signal to node 480 to set the initial operating point of laser diode 450 and accordingly set an initial magnitude of the power of light of laser diode 450.

In step 708, processing circuit 220 measures the magnitude of the voltage at node 470. Suppose that value measured by processing circuit 220 is 1.29V.

In step 712, processing circuit 220 compares the measured value (e.g., 1.29V) to the value of the upper golden voltage (e.g., 1.51V). If the measured voltage at node 470 is greater than the upper golden voltage, the power provided by laser diode 450 is greater than the limit set for the region, so control moves to step 718 to decrease the duty cycle of the PWM signal to decrease the power of the light provided by laser diode 450. If the measured value is less than the upper golden voltage, as it is in this example, the power of the light from laser diode 450 does not exceed the maximum limit for the region, but the power provided may be too low, so control moves to step 714.

In step 714, processing circuit 220 compares the value of the voltage measured at node 470 (e.g., 1.29V) to the value of the lower golden voltage (e.g., 1.42V). If the measure value is less than the lower golden voltage, as it is in this example, the power provided by laser diode 450 is too low for the power to be about the same as the predetermined limit or less than the lower range of power set for the region. If the measured value is less than the lower golden voltage, control moves to step 716 to increase the duty cycle of the PWM signal to increase the power of the light provided by laser diode 450.

If the measured value is greater than or equal to the lower golden voltage, then voltage measured at node 470 is less than or equal to the upper golden voltage and is greater than or equal to the lower golden voltage, so power of the light provided by laser diode 450 is about the same as the predetermined power or it lies within the predetermined range, so the operating point of laser diode 450 has been successfully set for the region and temperature. Because the voltage measured at node 470 lies within the range of upper and lower golden voltages, the process is complete and ends.

In step 716, processing circuit 220 increases the duty cycle of the PWM signal impressed on node 480. Increasing the duty cycle of the PWM signal increases the current that flows through laser diode 450 thereby increasing the magnitude of light provided by laser diode 450.

In step 718, processing circuit 220 decreases the duty cycle of the PWM signal impressed on node 480. Decreasing the duty cycle of the PWM signal decreases the current that flows through laser diode 450 thereby decreasing the magnitude of light provided by laser diode 450.

Processing circuit 220 repeats steps 706 through 718 to set the operating point of laser diode 450 so that the power of light provided by laser diode 450 is appropriate for the region of operation of the laser diode.

Because handle 210 includes more than one laser diode and each laser diode needs to be monitored and adjusted separately.

Performing method 700 to set the power provided by the laser diode takes only milliseconds. Method 700 is performed when handle 210 is power up (e.g., safety off). Method 700 may further be performed periodically while handle 210 is power up to adjust the power of the light provided by the diode responsive to temperature changes.

Figure 3:
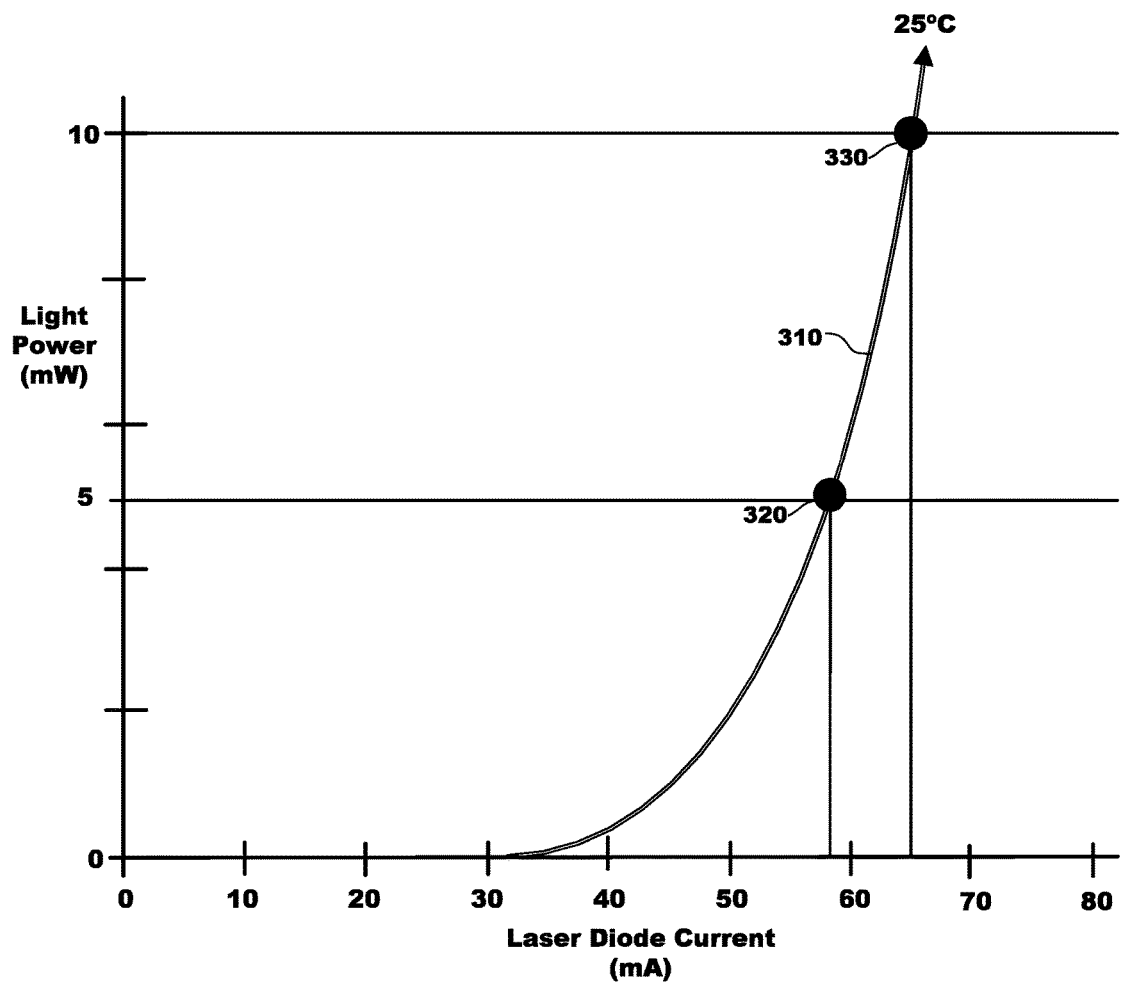
FIG. 3 is a diagram of the power vs. the current characteristic curves for a hypothetical laser diode for a single temperature.

The operating efficiency of a laser diode, ratio of the magnitude of the power output of light to the electrical input power, changes at different operating points of the laser diode. As the magnitude of the power of light provided by a laser diode increases the efficiency of the laser diode also increases. For example, the laser diode of the characteristic curve of FIG. 3 requires 58 mA to provide 5 mW of power, but for a small increase of 7 mA the laser diode provides 10 mW of power. To improve the battery life of a CEW, a laser diode may be operated at a higher power to more efficiently use the power from the battery; however, operating at a higher power may result in the laser diode providing light at a power that is greater than the limit for a region.

The power limits for a region are expressed as the average power of light provided by a diode. A laser diode may provide an average power that lies within the limit by switching the laser diode between two operating points. One operating point may provide light at a power that exceeds the regional limit and the other operating point may provide light at a power that is significantly less than the regional limit, so that the power output over time is less than or equal to the regional limit.

Figure 4:
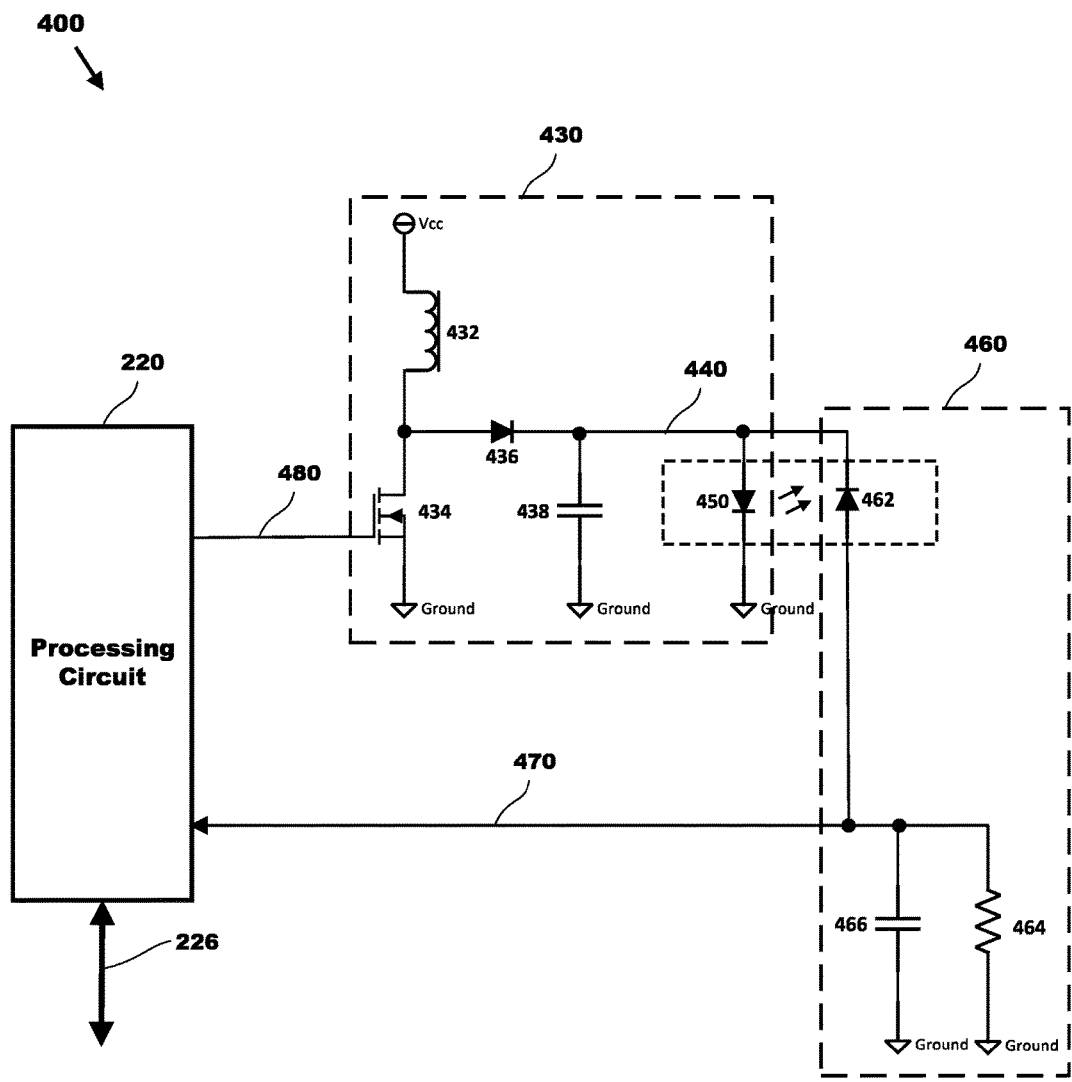
FIG. 4 is a diagram of an implementation of a circuit of the handle of FIG. 2 for calibrating the magnitude of the power of the light provided by a laser diode.

Referring to FIG. 4, laser diode 450 may be switched between operating points by changing the duty cycle of the PWM signal provided to node 480. For example, during a portion of a period of time, the PWM signal may have a higher duty cycle to operate laser diode at a higher power (e.g., higher instantaneous power) that exceeds the regional limit (e.g., 10 mW) and for the remaining portion of the period of time at a lower duty cycle to operate the laser diode at a lower power (e.g., lower instantaneous power) (e.g., 3 mW) that is less than the regional limit, so that the average power provided by laser diode 450 over the period is about the same as the regional limit (e.g., 5 mW).

Another method for operating a laser diode to provide light at an average power over a period is to operate the laser diode at a power (e.g., instantaneous power) that is greater than the regional limited, to increase the operating efficiency of the laser diode, then switch the laser diode off and on at a duty cycle so that the average power provided by the laser diode is about the same as the predetermined power for the region. While the laser diode is off, it provides not light.

Altering the operation of the diode to provide an average power is referred to herein as power modulation. The duty cycles for changing the operating point of the laser diode or for turning the laser diode on and off may be determined during calibration. Power modulation to provide a predetermined power may relate to a golden voltage, so that detecting a voltage and comparing the detected voltage to the golden voltage is sufficient to determine the power of light provided by the laser diode.

Figure 8:
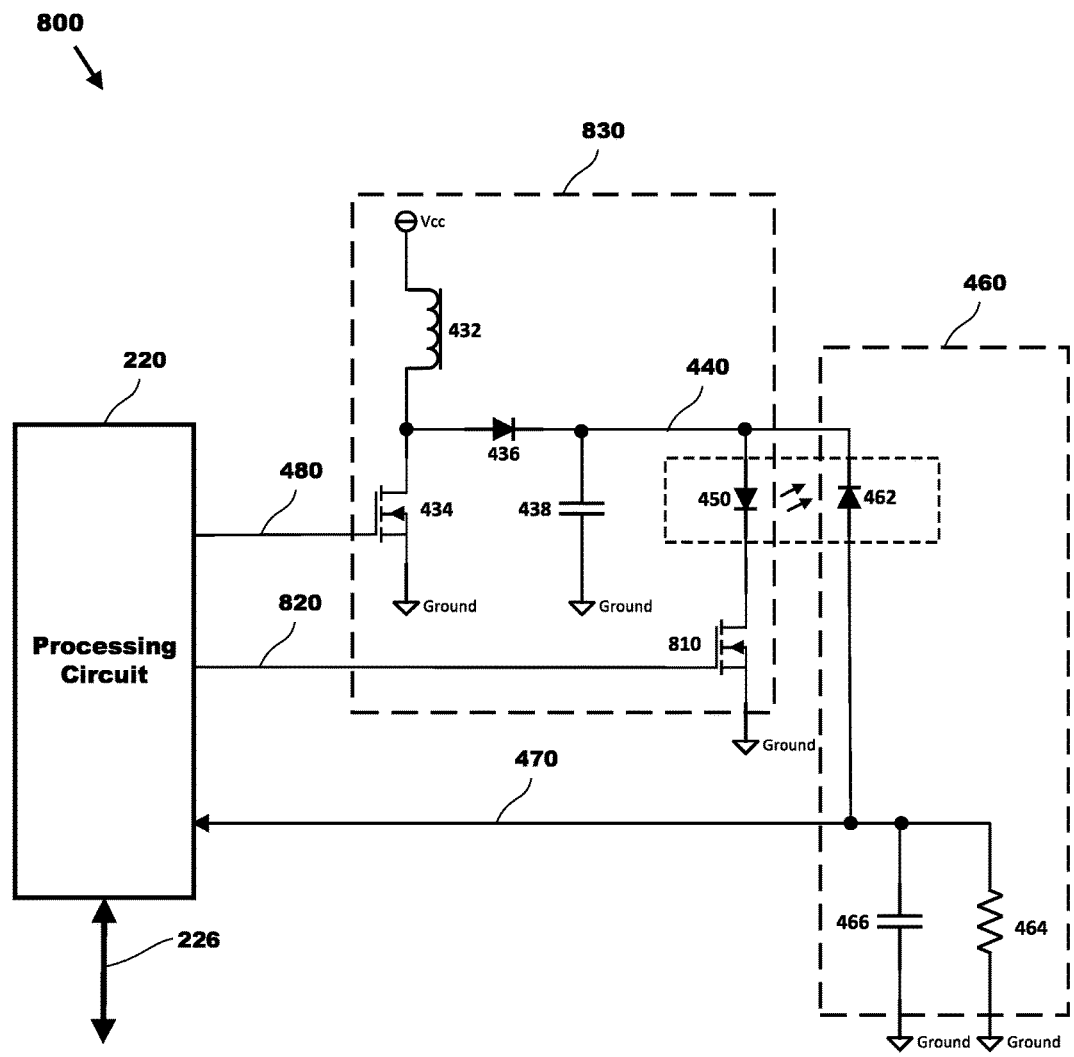
FIG. 8 is a diagram of another implementation of a circuit of the handle of FIG. 2 for calibrating the magnitude of the power of the light provided by a laser diode.

Circuit 800 of FIG. 8 is an example of a circuit that uses a PWM signal to turn laser diode 450 on and off at a duty cycle to perform power modulation. Circuit 830 sets the operating point of laser diode 450 as discussed above with respect to circuit 400 and in particular circuit 430 in addition to switching laser diode 450 on and off.

For example, processing circuit 220 provides a PWM signal to node 480 to set the operating point of laser diode 450. Processing circuit 220 further provides a PWM signal to node 820. The PWM signal on node 820 controls switch (e.g., FET transistor) 810 to enable (e.g., switch on) laser diode 450 and to disable (e.g., switch off) laser diode 450. When laser diode 450 is switched on, current flows through laser diode 450 and laser diode 450 provides light at the power (e.g., power greater than regional limit) set by the PWM signal impressed on node 480. When laser diode 450 is switched off, no current flows through laser diode 450 and laser diode 450 provides no light (e.g., zero power).

The ratio of the portion of time that laser diode 450 is on for a period of time determines the average power of light provided by laser diode 450 during the period of time. The average power of the light provided by laser diode 450 may be increased by increasing the portion of time that laser diode 450 is on during the period. The average power of the light provided by laser diode 450 may be decreased by decreasing the portion of the time that laser diode 450 is on during the period. The duty cycle of the PWM signal impressed on node 820 determines the portion of time that laser diode 450 is on during the period of the PWM signal.

During calibration, tester 130 measures and reports the average power of the light provided by laser diode 450 for the operating point set by the PWM signal on node 480 and the power modulation set by the PWM signal on node 820. Photo detector 462 provides a current that is proportional to the power of the light provided by laser diode 450 while it is turned on and no current when laser diode 450 is turned off. Capacitor 466 in combination with resistor 464 has a response time that is slower than (e.g., an order of magnitude) the period of the PWM signals on node 480 and/or node 820 so that the voltage across capacitor 466 and resistor 464 is not affected by the changes and represents the golden voltage when laser diode 450 is providing the desired average power as measured by tester 130.

Figure 9:
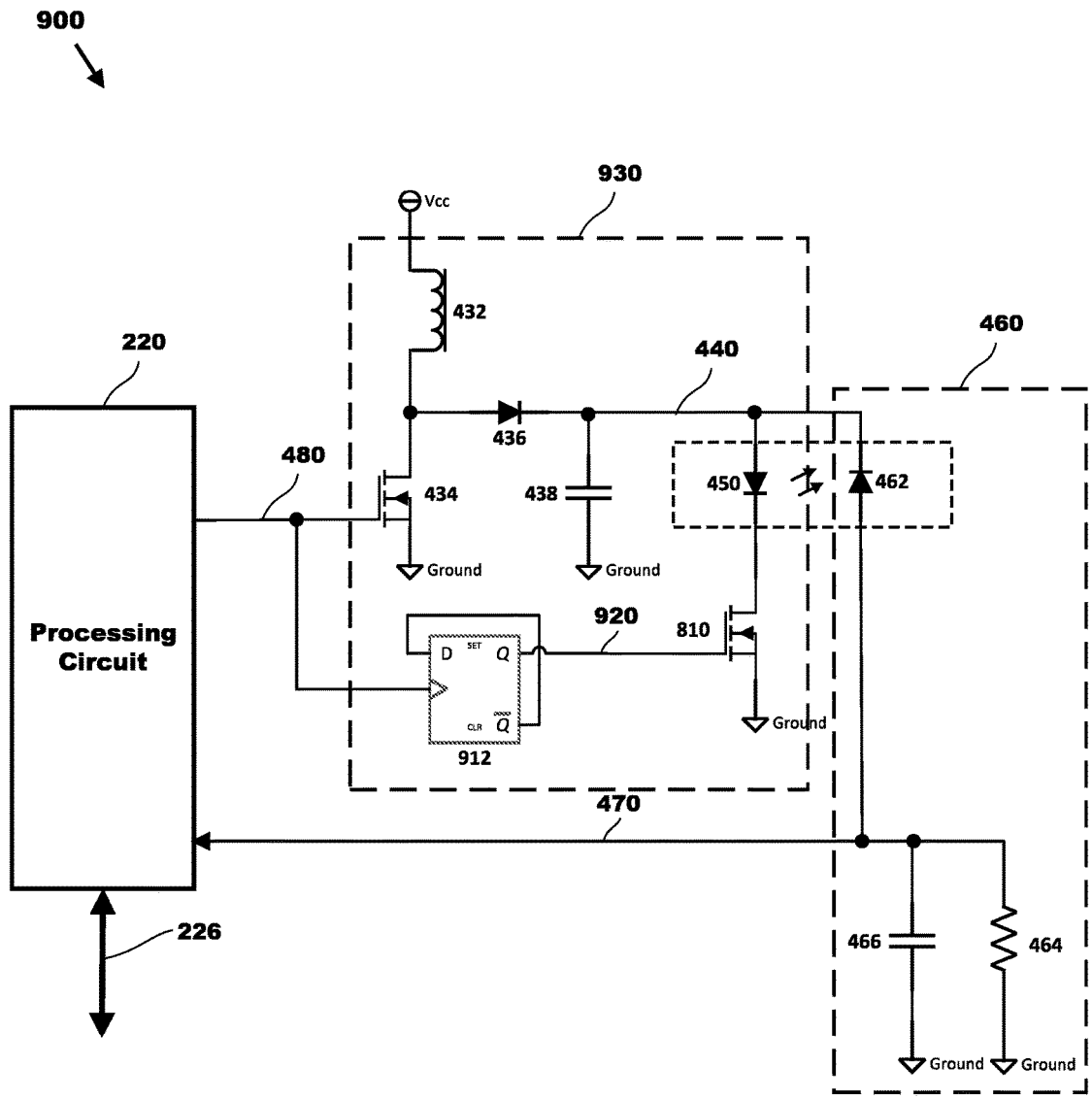
FIG. 9 is a diagram of another implementation of a circuit of the handle of FIG. 2 for calibrating the magnitude of the power of the light provided by a laser diode.

Circuit 900 of FIG. 9 is similar to circuit 800. Circuit 900 differs from circuit 800 only in how power modulation PWM signal 920 is generated. In circuit 900, PWM signal 480 drives the input of divide-by-two counter 912. The output of divide-by-two counter 912 drives node 920. The PWM signal on node 920 controls switch (e.g., FET transistor) 810 to provide power modulation of laser diode 450.

Figure 10:
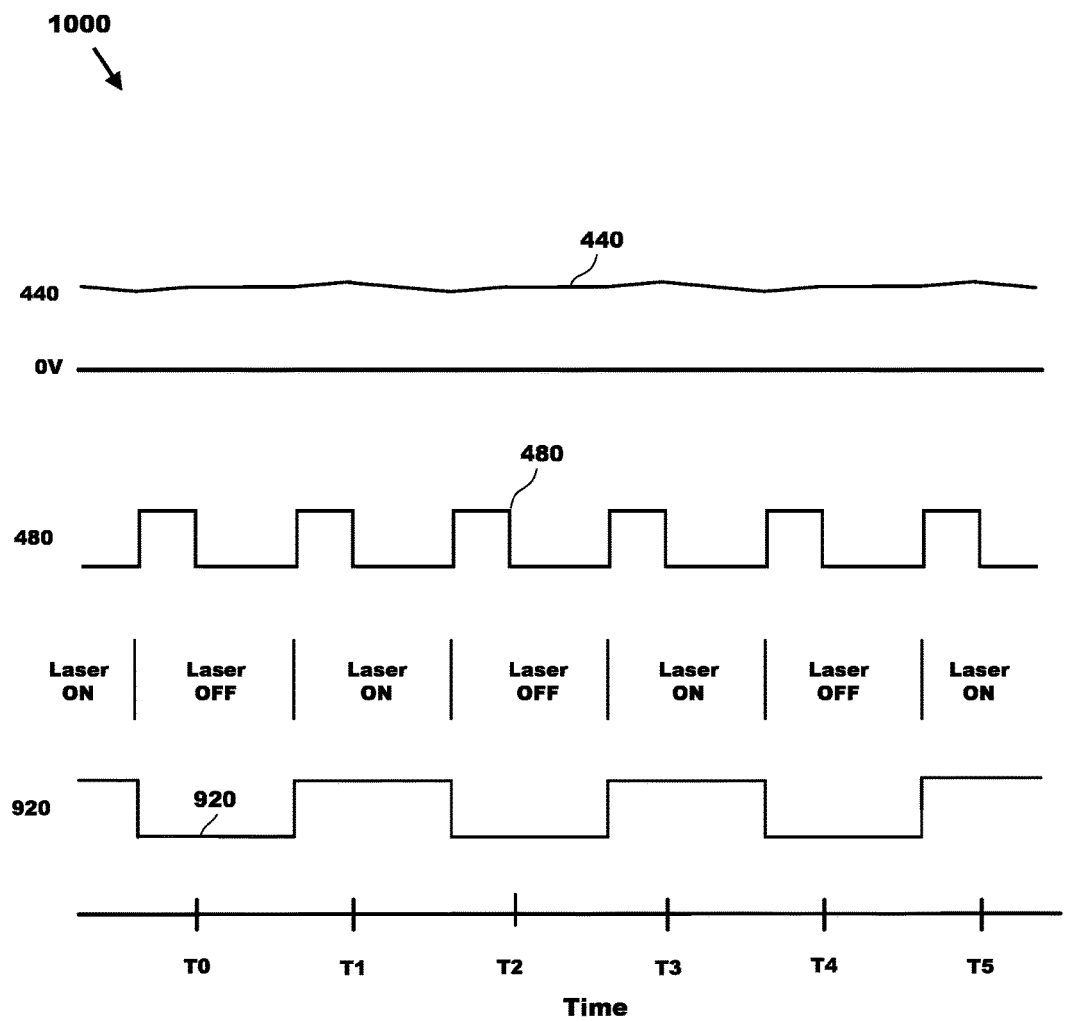
FIG. 10 is a diagram of voltages of the circuit of FIG. 5 while operating the laser diode.
Figure 11:
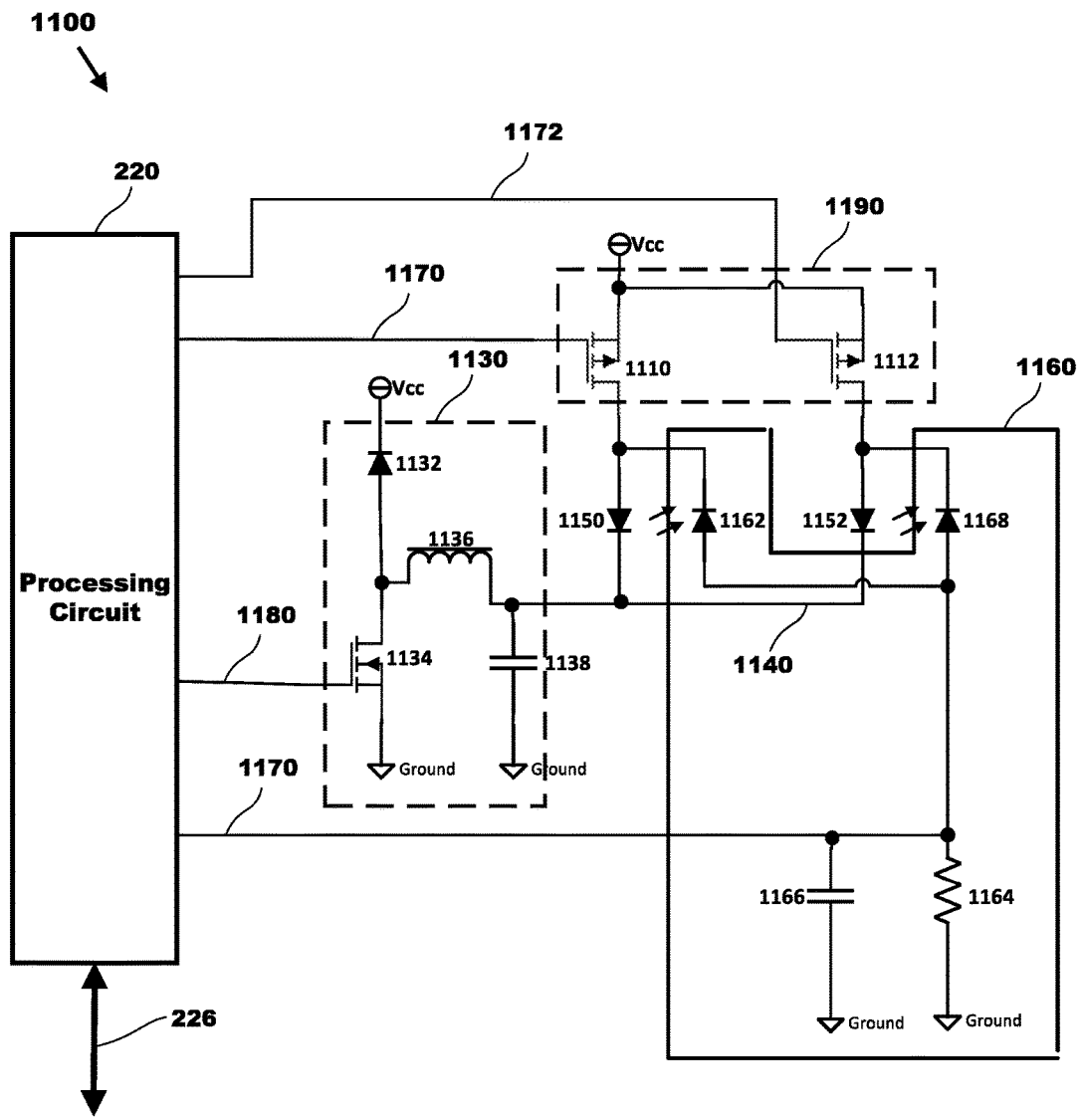
FIG. 11 is a diagram of another implementation of a circuit of the handle of FIG. 2 for calibrating the magnitude of the power of the light provided by a laser diode.

The relationship of PWM signals 480 and 920 are illustrated in FIG. 10. The duration of the on-time (e.g., high signal) of PWM signal 920 is equal to the period of PWM signal 480. The on-time of PWM signal 920 represents the time when laser diode 450 is switched on. The duration of the off-time (e.g., low signal) of signal 920 is also equal to the period of PWM signal 480. The off-time of PWM signal 920 represents the time when laser diode 450 is switched off. The duty cycle of PWM signal 920 is fixed at 50 percent.

Circuit 1100 is an example of a circuit that sets the operating point of two laser diodes and detects the magnitude of output power of the light of each laser diode one at a time. Operation of the two laser diodes are not concurrent. Processing circuit 220 selects which laser diode, laser diode 1150 or laser diode 1152, is operational, allowing only one laser diode to operate at a time. Circuit 1100 performs the functions of a circuit that sets the operating point of a laser diode during calibration and operation in the field as discussed above. Circuit 1100 further performs the functions of a detector circuit discussed above. Circuit 1100 includes processing circuit 220, enable circuit 1190, operating point circuit 1130, and detector circuit 1160. Circuits 1130, 1160, and 1190 combined are an example implementation of red laser 216 and red laser 218.

Processing circuit 220 performs the functions of a processing circuit discussed above. Processing circuit 220 uses signal 1170 and signal 1172 to turn laser diode 1150 and laser diode 1152 respectively on and off. Processing circuit 220 provides a signal on node 1170 to control switch 1110 to enable laser diode 1150 by connecting the anode of laser diode 1150 to Vcc (e.g. power) and to disable laser diode 1150 by disconnecting the anode of laser diode from Vcc. When laser diode 1150 is switched on, current flows through laser diode 1150 and laser diode 1150 provides light at a power set by the duty cycle of the PWM signal impressed on node 1180. When laser diode 1150 is switched off, no current flows through laser diode 1150 and laser diode 1150 provides no light.

Operating point circuit 1130 sets the operating point of the laser diode that is enabled by controlling the voltage at the cathode of laser diode 1150 or laser diode 1152 by providing a PWM signal on node 1180. Reducing the voltage on the cathode (node 1140) of laser diode 1150 or laser diode 1152 increases current flow through the laser diode. Decreasing the duty cycle (e.g., less on-time) of signal 1180 increases the voltage on node 1140 and thereby decreases the current flow through laser diode 1150 or laser diode 1152.

Because laser diodes 1150 and 1152 do not operate concurrently, processing circuit 220 may calibrate and operate each laser diode separately. Detector circuit 1160 generates a voltage at node 1170 that relates to the power of the light provided by the laser diode that is enabled. Each laser diode/photo detector pair (e.g., 1150/1162, 1152/1168) may be calibrated to find a golden voltage as discussed above. Each laser diode/photo detector pair is associated with its own golden voltage. Golden voltages may differ for each laser diode/photo detector pair.

Photo detectors 1162 and 1168 provide a current that is proportional to the magnitude of the power of the light provided by laser diodes 1150 and 1152 respectively. Capacitor 1166 in combination with resistor 1164 has a response time that is slower than (e.g., an order of magnitude) the period of the PWM signal on node 1180 so that the voltage across capacitor 1166 and resistor 1164 is not affected by the changes and represents the golden voltage when laser diode 1150 or 1152 is providing the desired average power as measured by tester 130.

The foregoing description discusses embodiments, which may be changed or modified without departing from the scope of the invention as defined in the claims. Examples listed in parentheses may be used in the alternative or in any practical combination. As used in the specification and claims, the words 'comprising', 'comprises', 'including', 'includes', 'having', and 'has' introduce an open-ended statement of component structures and/or functions. In the specification and claims, the words 'a' and 'an' are used as indefinite articles meaning 'one or more'. When a descriptive phrase includes a series of nouns and/or adjectives, each successive word is intended to modify the entire combination of words preceding it. For example, a black dog house is intended to mean a house for a black dog. While for the sake of clarity of description, several specific embodiments of the invention have been described, the scope of the invention is intended to be measured by the claims as set forth below. In the claims, the term "provided" is used to definitively identify an object that not a claimed element of the invention but an object that performs the function of a workpiece that cooperates with the claimed invention. For example, in the claim "an apparatus for aiming a provided barrel, the apparatus comprising: a housing, the barrel positioned in the housing", the barrel is not a claimed element of the apparatus, but an object that cooperates with the "housing" of the "apparatus" by being positioned in the "housing". The invention includes any practical combination of the structures and methods disclosed. While for the sake of clarity of description several specifics embodiments of the invention have been described, the scope of the invention is intended to be measured by the claims as set forth below.

The location indicators "herein", "hereunder", "above", "below", or other word that refer to a location, whether specific or general, in the specification shall be construed to refer to any location in the specification where the location is before or after the location indicator.

What is claimed is:

1. A weapon that cooperates with a provided tester, the weapon comprising:
   a processing circuit; a laser diode that provides a light; a photo diode that detects the light; a resistor coupled in series with the photo diode; and
   a memory having computer-executable instructions stored thereon that, in response to execution by the processing circuit, cause the weapon to:
   provide a signal at a duty cycle to establish a power of the light provided by the laser diode, the light induces a first current through the photo diode, the first current is related to the power of the light the first current flows through the resistor thereby inducing a first voltage across the resistor, the first voltage is related to the power of the light:
   provide the light to the tester, the tester measures a magnitude of the power of the light and sends a message to the weapon to report the magnitude of the power:
   receive the message from the tester regarding the magnitude of the power as measured by the tester;
   compare the magnitude of the power as measured by the tester to a predetermined range, the predetermine range associated with a geographic region where the laser diode will be used:
   adjust the duty cycle responsive to the comparison;
   repeat providing the light to the tester, receiving the message from the tester, comparing the magnitude, and adjusting the duty cycle until the magnitude of the power as measured by the tester is within the predetermined range; and
   record a magnitude of the first voltage in the memory whereby the magnitude of the first voltage corresponds to the predetermined range.

2. The weapon of claim 1 wherein the predetermined range is any power that is less than or equal to a maximum power for a region.

3. The weapon of claim 1 further comprising a first switch, wherein the signal operates the first switch to establish a second voltage across the laser diode to establish the magnitude of the power of the light.

4. The weapon of claim 3 further comprising a second switch coupled in series with the laser diode, wherein the signal operates the second switch to switch the laser diode on and off.

5. The weapon of claim 4 wherein:
a first portion of the duty cycle operates the second switch to permit a second current to flow through the laser diode; and
a second portion of the duty cycle operates the second switch to stops the second current to flow through the laser diode.

6. The weapon of claim 1 further comprising a capacitor in parallel with the resistor, wherein an RC time constant of the capacitor and the resistor is greater than a period of the signal.

7. A method performed by a weapon for calibrating a power of a light provided by a laser diode of the weapon, the method comprising:
providing a signal at a duty cycle to establish the power of the light provided by the laser diode, the light induces a current through a photo diode that is related to the power of the light, the current flows through a resistor coupled in series with the photo diode; providing the light to a tester, the tester measures a magnitude of the power of the light and sends a message to the weapon to report the magnitude of the power:
receiving the message from a tester regarding the magnitude of the power of the light as measured by the tester;
comparing the magnitude of the power as measured by the tester to a predetermined range, the predetermine range associated with a geographic region where the laser diode will be used:
responsive to comparing, adjusting the duty cycle;
repeating providing, receiving, comparing, and adjusting until the magnitude of the power as measured by the tester is within the predetermined range; and
recording a magnitude of a voltage established by the current across the resistor whereby the magnitude of the voltage relates to the predetermined range.

8. The method of claim 7 wherein providing the signal comprises providing the signal to a boost circuit to establish an operating point of the laser diode.

9. The method of claim 7 wherein comparing comprises determining that the magnitude of the power as measured by the tester is less than a maximum magnitude.

10. The method of claim 7 wherein adjusting comprises:
changing the duty cycle to increase the magnitude of the power of the light when the magnitude measured by the tester is less than a minimum magnitude; and
changing the duty cycle to decrease the magnitude of the power of the light when the magnitude measured by the tester is greater than a maximum magnitude.

11. The method of claim 7 wherein recording comprises recording indicia of a magnitude of the voltage in a computer-readable memory.

12. A weapon that cooperates with a provided tester, the tester separate from the weapon, the weapon comprising:
a processing circuit;
a laser diode that provides a light;
a photo diode that in response to the light provides a first current, the first current related to a power of the light;
a resistor coupled in series with the photo diode, a first voltage across the resistor related to the first current; and
a memory; wherein the processing circuit:
provides a signal at a duty cycle to establish the power of the light;
provides the light to the tester, the tester measures a magnitude of the power of the light and sends a message to the weapon to report the magnitude of the power;
receives the message from the tester regarding the magnitude of the power as measured by the tester;
compares the magnitude of the power to a predetermined range, the predetermine range associated with a geographic region where the laser diode will be used;
adjusts the duty cycle responsive to the comparison;
repeats providing the light to the tester, receiving the message from the tester, comparing the magnitude, and adjusting the duty cycle until the magnitude of the power as measured by the tester is within the predetermined range; and
records a magnitude of the first voltage in the memory whereby the magnitude of the first voltage corresponds to the predetermined range.

13. The weapon of claim 12 wherein the predetermined range is any power that is less than or equal to a maximum power for a region.

14. The weapon of claim 12 further comprising a first switch, wherein the signal operates the first switch to establish a second voltage across the laser diode to establish the magnitude of the power of the light.

15. The weapon of claim 14 further comprising a second switch coupled in series with the laser diode, wherein the signal operates the second switch to switch the laser diode on and off.

16. The weapon of claim 15 wherein:
a first portion of the duty cycle operates the second switch to permit a second current to flow through the laser diode; and
a second portion of the duty cycle operates the second switch to stops the second current to flow through the laser diode.

17. The weapon of claim 12 further comprising a capacitor in parallel with the resistor, wherein an RC time constant of the capacitor and the resistor is greater than a period of the signal.

* * * * *

UNITED STATES PATENT AND TRADEMARK OFFICE
CERTIFICATE OF CORRECTION

PATENT NO. : 10,461,499 B2
APPLICATION NO. : 15/658001
DATED : October 29, 2019
INVENTOR(S) : Magne Nerheim Page 1 of 1

It is certified that error appears in the above-identified patent and that said Letters Patent is hereby corrected as shown below:

In the Claims

In Column 24, Line 41, please delete "the light:" and insert --the light;--

In Column 24, Lines 44-45, please delete "the power:" and insert --the power;--

In Column 24, Line 51, please delete "be used:" and insert --be used;--

In Column 25, Line 10, please delete "stops" and insert --stop--

In Column 25, Line 26, please delete "the power:" and insert --the power;--

In Column 25, Line 33, please delete "be used:" and insert --be used;--

In Column 26, Line 49, please delete "stops" and insert --stop--

Signed and Sealed this
Fourteenth Day of January, 2020

Andrei Iancu
*Director of the United States Patent and Trademark Office*